(12) United States Patent
Oh et al.

(10) Patent No.: US 9,673,254 B2
(45) Date of Patent: Jun. 6, 2017

(54) LIGHT EMITTING DEVICE

(71) Applicant: LG INNOTEK CO., LTD., Seoul (KR)

(72) Inventors: So Yeong Oh, Seoul (KR); Byung Yeon Choi, Seoul (KR); Ji Hwan Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 59 days.

(21) Appl. No.: 14/336,574

(22) Filed: Jul. 21, 2014

(65) Prior Publication Data

US 2015/0021638 A1  Jan. 22, 2015

(30) Foreign Application Priority Data

Jul. 22, 2013 (KR) .................. 10-2013-0085959
Jul. 4, 2014 (KR) .................. 10-2014-0083640

(51) Int. Cl.

| H01L 27/15 | (2006.01) |
|---|---|
| H01L 33/38 | (2010.01) |
| H01L 33/20 | (2010.01) |
| H01L 33/62 | (2010.01) |
| H01L 33/00 | (2010.01) |
| H01L 33/12 | (2010.01) |

(52) U.S. Cl.
CPC .......... *H01L 27/156* (2013.01); *H01L 33/387* (2013.01); *H01L 33/007* (2013.01); *H01L 33/12* (2013.01); *H01L 33/20* (2013.01); *H01L 33/62* (2013.01); *H01L 2224/48091* (2013.01)

(58) Field of Classification Search
CPC .................. H01L 27/156; H01L 33/387
See application file for complete search history.

(56) References Cited

U.S. PATENT DOCUMENTS

| 8,461,604 | B2 * | 6/2013 | Braune et al. .................. 257/88 |
| 2004/0075399 | A1 * | 4/2004 | Hall .............................. 315/291 |
| 2010/0006870 | A1 * | 1/2010 | Lee ........................ H01L 27/153 |
| | | | 257/88 |
| 2010/0052494 | A1 | 3/2010 | Feng et al. |
| 2011/0204387 | A1 | 8/2011 | Kim et al. |

(Continued)

FOREIGN PATENT DOCUMENTS

| EP | 1 973 161 A2 | 9/2008 |
| JP | 2012-028821 A | 2/2012 |

(Continued)

*Primary Examiner* — Fernando L Toledo
*Assistant Examiner* — Lawrence-Linh T Nguyen
(74) *Attorney, Agent, or Firm* — Birch, Stewart, Kolasch & Birch, LLP

(57) ABSTRACT

Disclosed is a light emitting device comprising a plurality of light emitting cells, and a bridge electrode electrically connecting two adjacent light emitting cells, and the plurality of light emitting cells comprise a light emitting structure including a first conductive semiconductor layer, a second conductive semiconductor layer and an active layer between the first conductive semiconductor layer and the second conductive semiconductor layer, a first electrode on the first conductive semiconductor layer and a second electrode on the second conductive semiconductor layer, wherein the bridge electrode has a part thicker than the first electrode and the second electrode.

17 Claims, 19 Drawing Sheets

(56) References Cited

U.S. PATENT DOCUMENTS

2011/0222285 A1  9/2011 Ye et al.
2012/0061694 A1  3/2012 Shen et al.

FOREIGN PATENT DOCUMENTS

KR  10-2009-0053435 A      5/2009
KR  10-2010-0028461 A      3/2010
TW      EP 2889910 A1 *   7/2015   ........... H01L 27/153

* cited by examiner

_US 9,673,254 B2_

LIGHT EMITTING DEVICE

CROSS REFERENCE TO RELATED APPLICATION

This application claims priority to Korean Patent Application No. 10-2013-0085959, filed in Korea on Jul. 22, 2013, and Korean Patent Application No. 10-2014-0083640, filed in Korea on Jul. 4, 2014, are hereby incorporated in its entirety by reference as if fully set forth herein.

TECHNICAL FIELD

Embodiments relate to a light emitting device.

BACKGROUND

Light emitting devices such as light emitting diodes (LEDs) or laser diodes (LDs) using Group III-V or II-VI compound semiconductor materials render a variety of colors such as red, green, blue and ultraviolet rays in accordance with development of thin film growth methods and device materials. Light emitting devices efficiently realize white rays using fluorescent materials or combining colors, and have advantages such as low power consumption, semi-permanent lifespan, high response speed, stability and eco-friendliness, as compared to conventional light sources such as fluorescent lamps and incandescent lamps.

Therefore, these light emitting elements are increasingly applied to transmission modules of optical communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, headlights for vehicles and traffic lights.

A light emitting device including a plurality of the light emitting cells in series or in parallel may include bridge electrode electrically contacting adjacent light emitting cells. Current concentration on the bridge electrode having the narrow area may lead to deterioration in reliability of the light emitting device, such as the bridge electrode 150 being burned.

SUMMARY

Embodiments provide a light emitting device to increase the area of the bridge electrode and prevent deterioration in reliability of the light emitting device.

In one embodiment, a light emitting device includes a plurality of light emitting cells and a bridge electrode electrically connecting two adjacent light emitting cells. The plurality of light emitting cells comprise a light emitting structure including a first conductive semiconductor layer, a second conductive semiconductor layer and an active layer between the first conductive semiconductor layer and the second conductive semiconductor layer, a first electrode on the first conductive semiconductor layer, and a second electrode on the second conductive semiconductor layer. The bridge electrode has a part thicker than the first electrode and the second electrode.

A width of the bridge electrode may be greater than a width of the first electrode layer or a width of the second electrode layer.

The light emitting structure may include an etched region exposing a part of the first semiconductor layer and the first electrode layer may be disposed on an exposed part of the first semiconductor layer.

The bridge electrode may comprise a first part contacting the first electrode in one of the two adjacent light emitting cells, a second part contacting the second electrode in the other of the two adjacent light emitting cells, and a third part disposed between the first part and the second part.

A thickness of the third part may be the greatest among thicknesses of the first part, the second part, and the third part.

The third part may be disposed between the two adjacent light emitting cells.

A height of the first part may be equal to a height of the first electrode and a height of the second part may be equal to a height of the second electrode.

The bridge electrode may be plural in number.

One portion of the first part may be disposed on the first electrode and one portion of the second part may be disposed on the second electrode.

The bridge electrode may further comprise a fourth part disposed between the first part and the third part and between the second part and the third part, wherein a thickness of the fourth part may be smaller than a thickness of the first part, a thickness of the second part and a thickness of the third part.

In another embodiment, a light emitting device includes a plurality of light emitting cells, and a plurality of bridge electrodes electrically connecting two adjacent light emitting cells, wherein the plurality of light emitting cells comprise a light emitting structure including a first conductive semiconductor layer, a second conductive semiconductor layer and an active layer between the first conductive semiconductor layer and the second conductive semiconductor layer, wherein the bridge electrode electrically connects the first conductive semiconductor layer in one of the two adjacent light emitting cells to the second conductive semiconductor layer in the other of the two adjacent light emitting cells and the plurality of bridge electrodes are disposed between the two adjacent light emitting cells.

The plurality of light emitting cells may further comprise a first electrode on the first conductive semiconductor layer; and a second electrode on the second conductive semiconductor layer, wherein the plurality of bridge electrodes are disposed between the first electrode in one of the two adjacent light emitting cells and the second electrode in the other of the two adjacent light emitting cells and spaced away from each other.

The first electrode and the second electrode may have a first length direction and the plurality of the bridge electrodes may have a second length direction which is different with the first length direction.

The plurality of bridge electrodes may comprise a first part on the first conductive semiconductor layer in one of the two adjacent light emitting cells, a second part on the second conductive semiconductor layer in the other of the two adjacent light emitting cells, and a third part between the first part and the second part.

A thickness of the third part may the greatest among thicknesses of the first part, the second part, and the third part.

A thickness of the first part or a thickness of the first part may be equal to a thickness of the third part.

A width of each of the bridge electrodes may be greater than a width of the first electrode layer or a width of the second electrode layer.

The light emitting device may further comprise a substrate disposed under the plurality of bridge electrodes and a first roughness formed on one region of an upper surface of the substrate between adjacent light emitting cells.

The third part may be disposed on the one region of an upper surface of the substrate between adjacent light emitting cells, and a second roughness corresponding to the first roughness may be formed on an upper surface of the third part. In one embodiment, a light emitting device package includes a package body, a first lead frame and a second lead frame disposed on a surface of the package body and a light emitting device according to one of the embodiments.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
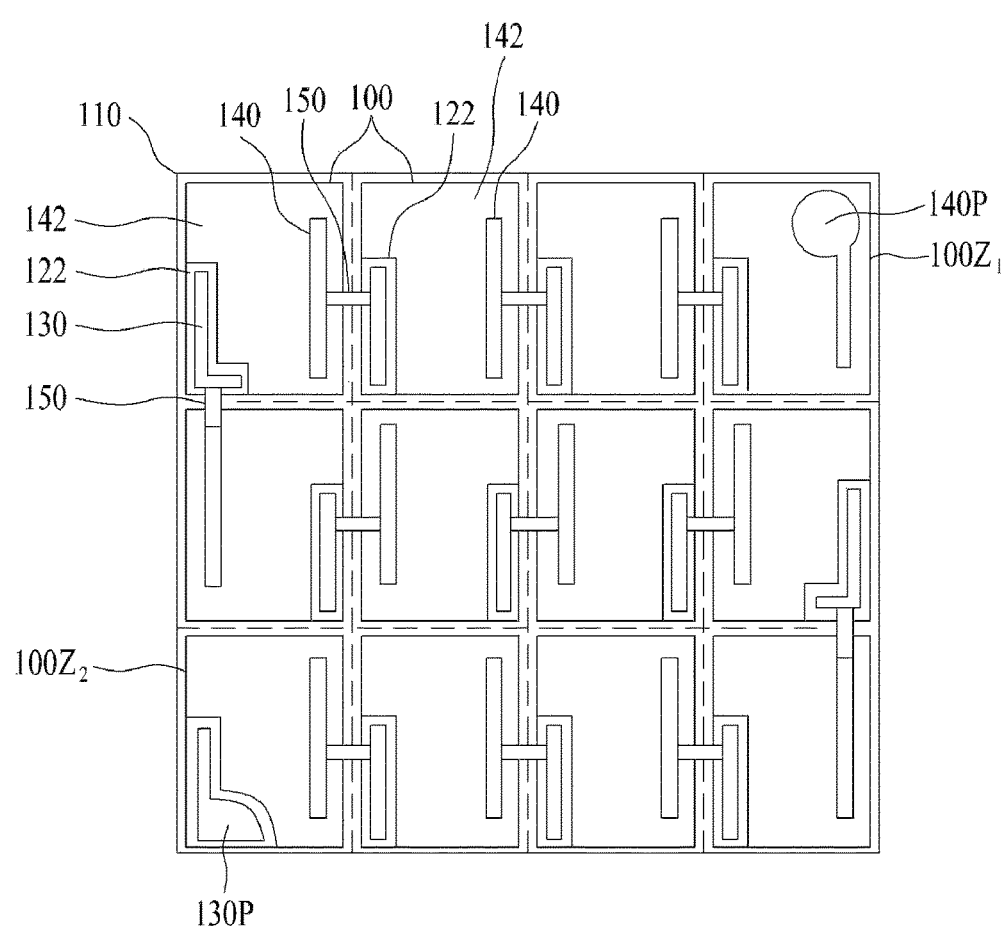
FIG. 1 is a plan view illustrating a light emitting device according to first embodiment.

Hereinafter, embodiments will be clearly understood from the description taken in conjunction with the annexed drawings and the embodiments.

Prior to description of the embodiments, with regard to description of preferred embodiments, it will be understood that, when one element such as a layer (film), a region or a structure is referred to as being formed "on" or "under" another element such as a substrate, a layer (film), a region, a pad or a pattern, the one element may be directly formed "on" or "under" the another element, or be indirectly formed "on" or "under" the another element via an intervening element present therebetween. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof.

Figure 2:
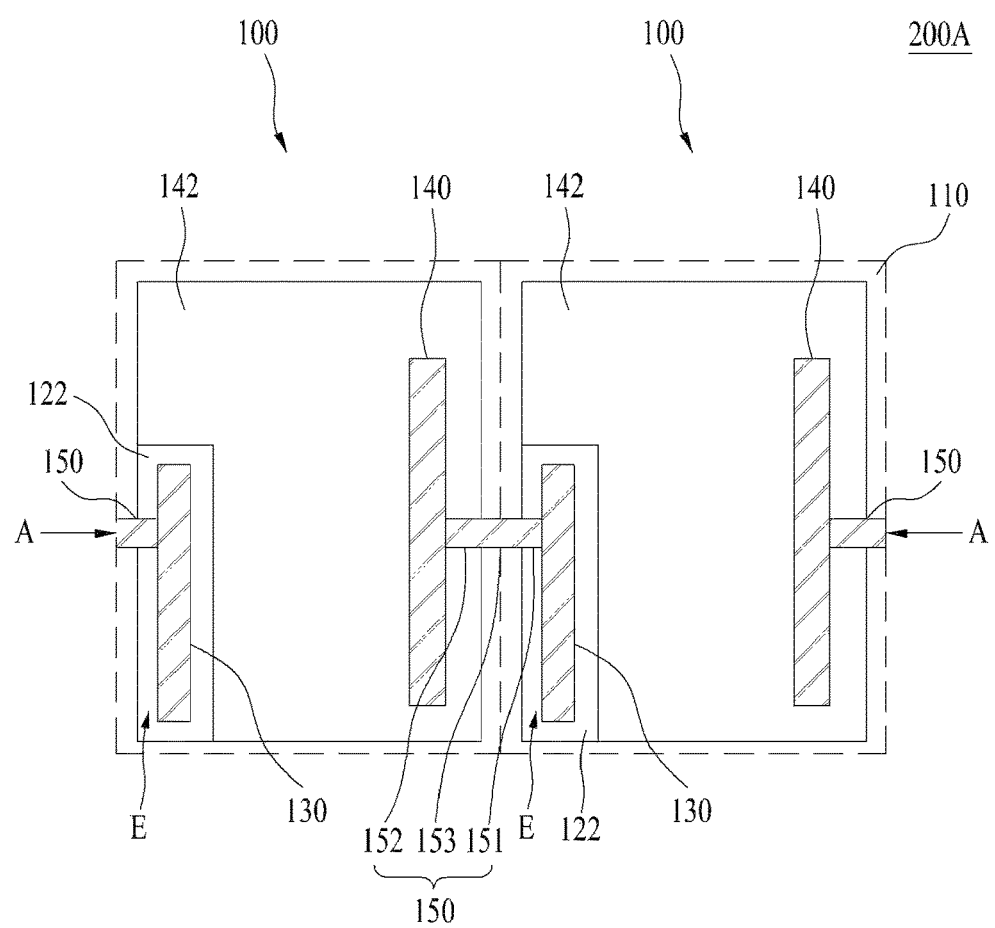
FIG. 2 is a plan view extending a part of FIG. 1.
Figure 3:
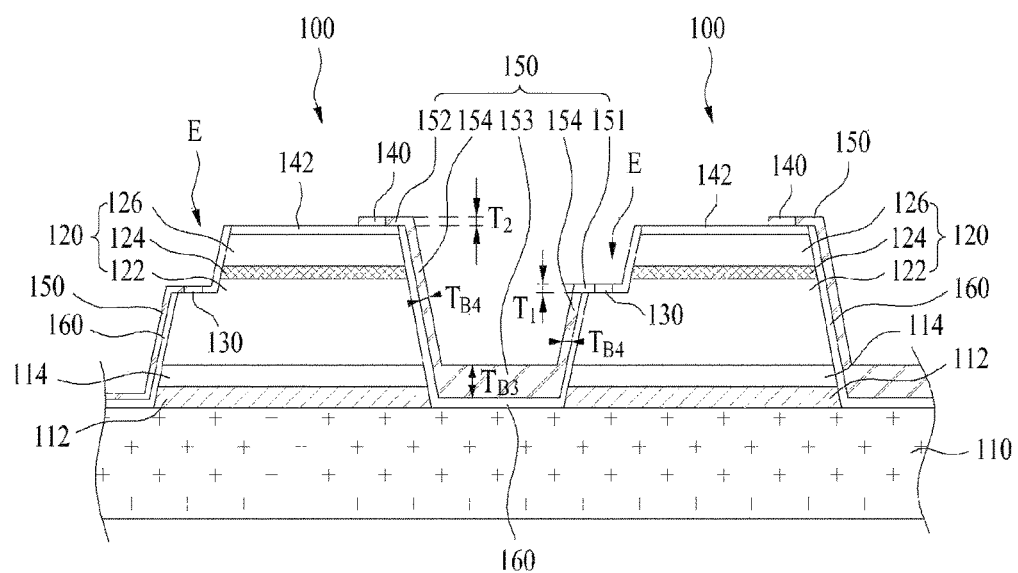
FIG. 3 is a sectional view taken along the direction AA of the light emitting device shown in FIG. 2.

FIG. 1 is a plan view illustrating a light emitting device 200A according to first embodiment. FIG. 2 is a plan view extending a part of FIG. 1. FIG. 3 is a sectional view taken along the direction AA of the light emitting device shown in FIG. 2.

Referring to FIGS. 1 to 3, the light emitting device 200A includes a plurality of light emitting cells 100, and a bridge electrode 150 electrically connecting two adjacent light emitting cells.

The plurality of light emitting cells 100 may include light emitting diode formed with a plurality of Group III-V compound semiconductors, for example, semiconductor layer including Group III and V elements or Group II and VI elements. And the light emitting diode may be color LED emitting red, blue, or green light, white LED, or UV LED. Light emitting from the LED may be realized with various embodiments by variety of material and concentration.

A substrate 110 is disposed under the plurality of light emitting cells 100. The plurality of light emitting cells 100 are supported by the substrate 110 and disposed on the substrate and spaced away from each other.

The substrate 110 may be formed of a material suitable for development of semiconductor materials. In addition, the substrate 110 may be formed of a material with high thermal conductivity and may be a conductive substrate or an insulating substrate.

For example, the substrate 110 may be sapphire ($Al_2O_3$) or a material including at least one of GaN, SiC, ZnO, Si, GaP, InP, $Ga_2O_3$ and GaAs. The substrate 110 may have roughness or unevenness on an upper surface to improve light extraction. Impurities on a surface of the substrate may be removed by wet cleaning or plasma processing.

The plurality of light emitting cells 100 may include a light emitting structure including a first conductive semiconductor layer 122, a second conductive semiconductor layer 126, and an active layer 124 between the first conductive semiconductor layer 122 and the second conductive semiconductor layer 126, and a first electrode on the first conductive semiconductor layer 122, and a second electrode on the second conductive semiconductor layer 126.

The light emitting structure 120 may be formed by Metal Organic Chemical Vapor Deposition, Chemical Vapor Deposition, Plasma-Enhanced Chemical Vapor Deposition, Molecular Beam Epitaxy, or Hydride Vapor Phase Epitaxy and so on, but the disclosure is not limited thereto.

The first conductive type semiconductor layer 122 may be formed with a semiconductor compound. The first conductive type semiconductor layer 122 may be realized with a Group III-V or Group II-VI compound semiconductor or the like, and may be doped with a first conductive dopant.

When the first conductive type semiconductor layer 122 is n-type semiconductor layer, the first conductive dopant may be n-type dopant including Si, Ge, Sn, Se, Te, but the disclosure is not limited thereto. When the first conductive type semiconductor layer 122 is p-type semiconductor layer, the first conductive dopant may be p-type dopant including Mg, Zn, Ca, Sr, Ba, but the disclosure is not limited thereto.

The first semiconductor layer 122 may be selected from semiconductor materials having a compositional formula of $In_xAl_yGa_{(1-x-y)}N$ ($0 \leq x \leq 1$, $0 \leq y \leq 1$, $0 \leq x+y \leq 1$). The first semiconductor layer 122 may include at least one of Ga, N, In, Al, As, or P. For example, the first semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The second conductive type semiconductor layer 126 may be formed with a semiconductor compound. The first conductive type semiconductor layer 126 may be realized with a Group III-V or Group II-VI compound semiconductor or the like, and may be doped with a second conductive dopant.

When the second conductive type semiconductor layer 126 is p-type semiconductor layer, the second conductive dopant may be p-type dopant including Mg, Zn, Ca, Sr, Ba, but the disclosure is not limited thereto. When the second conductive type semiconductor layer 126 is n-type semiconductor layer, the second conductive dopant may be n-type dopant including Si, Ge, Sn, Se, Te, but the disclosure is not limited thereto.

The second semiconductor layer 126 may be selected from semiconductor materials having a compositional formula of $In_xAl_yGa_{(1-x-y)}N$ ($0 \leq x \leq 1$, $0 \leq y \leq 1$, $0 \leq x+y \leq 1$). The second semiconductor layer 126 may include at least one of Ga, N, In, Al, As, or P. For example, the second semiconductor layer 126 may include at least one of GaN, InN, AlN, InGaN, AlGaN, InAlGaN, AlInN, AlGaAs, InGaAs, AlInGaAs, GaP, AlGaP, InGaP, AlInGaP, or InP.

Hereinafter, the first semiconductor layer 122 having n-type, and the second semiconductor layer 126 having p-type will be described as an embodiment.

A semiconductor layer (not shown) having an opposite polarity to the second conductive type semiconductor layer 126 may be formed on the second conductive type semiconductor layer 126. For example, when the second conductive type semiconductor layer 126 is p type semiconductor layer, n-type semiconductor layer may be formed on the second conductive type semiconductor layer 126. Accordingly, the light emitting structure 120 may include at least one of N-P, P-N, N-P-N and P-N-P junction structures.

The active layer 124 may be disposed between the first conductive semiconductor layer 122 and the second conductive semiconductor layer 126. The active layer 124 generates light based on energy generated in the process of recombination of electrons and holes and decided by energy band of material.

When the first conductive semiconductor layer 122 is n-type semiconductor layer and the second conductive semiconductor layer 126 is p-type semiconductor layer, the electrons may be supplied from the first conductive semiconductor layer 122 and the holes may be supplied from the second conductive semiconductor layer 126.

The active layer 124 may have single well structure, a multiple well structure, a quantum wire structure or a quantum dot structure. For example, the active layer 124 may be formed to have the multiple well structure by using a TMGa gas, NH3 gas, N2 gas, and TMIn gas, but the disclosure is not limited thereto.

When the active layer 124 is multiple well structure, it may include more than one pair including a well layer and a barrier layer, which is selected among InGaN/GaN, InGaN/InGaN, GaN/AlGaN, InAlGaN/GaN, GaAs(InGaAs)/AlGaAs, or GaP(InGaP)/AlGaP, but the disclosure is not limited thereto. The well layer may be made of a material having a lower band gap than that of the barrier layer.

The buffer layer 112 may be disposed between the light emitting structure 120 and the substrate 110. The buffer layer 112 may function to reduce difference in lattice constant between the substrate 110 and the light emitting structure 120.

The buffer layer 112 may be a nitride semiconductor including Group III and V elements. For example, the buffer layer 112 may include at least one of GaN, InN, AlN, InGaN, InAlGaN, or AlInN.

In addition, in order to improve crystallinity of the first conductive semiconductor layer 122, an undoped semiconductor layer 114 may be interposed between the substrate 110 and first conductive semiconductor layer 122. The undoped semiconductor layer 114 may be formed of the same material to the first conductive semiconductor layer 122, or may be formed of different material to the first conductive semiconductor layer 122. The undoped semiconductor layer 114 has a low electrical conductivity, as compared to the first semiconductor layer 122, since the undoped semiconductor layer is not doped with a first conductive dopant. The undoped semiconductor layer 114 on the buffer layer 112 contacts the first conductive semiconductor layer 122. The undoped semiconductor layer 114 may be grown at higher growing temperature than that of the buffer layer 112 and have better crystallinity, compare with the buffer layer 112.

A side wall of the light emitting structure 120 may have a sloped face. When the side wall of the light emitting structure 120 has a sloped face, an angle between the side wall of the light emitting structure 120 and the substrate 110 may be obtuse angle.

The light emitting structure 120 may include an etched region E exposing a part of the first conductive semiconductor layer 122. For example, the part of the first semiconductor layer 122 may be exposed by partially etching the second semiconductor layer 126, the active layer 124 and the first semiconductor layer 122.

The first electrode 130 may be disposed on the exposed part of the first conductive semiconductor layer 122. For example, the first electrode 130 may be disposed on the first semiconductor layer 122 exposed by the etched region E and the second electrode 140 may be disposed on the second semiconductor layer 126 which is not etched. The first electrode 130 may electrically connect with the first conductive semiconductor layer 122, and the second electrode 140 may electrically connect with the second conductive semiconductor layer 126.

The first electrode 130 and the second electrodes 140 may include a conductive material, for example, at least one of Mo, Cr, Ni, Au, Al, Ti, Pt, V, W, Pd, Cu, Rh, or Ir and have a single or multiple layer structure.

A transparent electrode layer 142 may be disposed on the second conductive semiconductor layer 126 before the second electrode 140 is formed.

In another embodiment, a part of the transparent electrode layer 142 may be opened to expose the second conductive semiconductor layer 126, and the second conductive semiconductor layer 126 may contact the second electrode 140.

In other embodiment, as shown by FIG. 3, the transparent electrode layer 142 may be disposed between the second conductive semiconductor layer 126 and the second electrode 140, and the second conductive semiconductor layer 126 may be electrically connected with the second electrode 140 by the transparent electrode layer 142.

The transparent electrode layer 142 may improve an electrical characteristics and electrical contact with the second electrode 140, and be formed to be a layer or to have a plurality of patterns.

A transparent conductive layer or metal may be selectively used for the conductive layer 130. For example, the conductive layer 130 may comprise at least one transparent conductive oxide of, for example, indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride, Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, but the disclosure is not limited thereto.

The bridge electrode 150 is disposed between two adjacent light emitting cells 100. Two adjacent light emitting cells 100 are electrically connected with each other by the bridge electrode 150.

As shown by FIGS. 1 to 3, the bridge electrode 150 may successively connect the first electrode 130 in one of two adjacent light emitting cells 100 to the second electrode 140 in the other of two adjacent light emitting cells 100 and the plurality of the light emitting cells 100 may be connected in series.

In another embodiment, as not shown, the electrodes having the same polarity of two adjacent light emitting cells 100 may be connected with each other, and the plurality of the light emitting cells 100 may be connected in parallel.

For example, referring FIG. 3, the bridge electrode 150 may connect one of two adjacent light emitting cells 100 to the other of two adjacent light emitting cells 100.

For example, the bridge electrode 150 may be extended from the second electrode 140 in one of two adjacent light emitting cells 100 to the first electrode 130 in the other of two adjacent light emitting cells 100 via a side faces of the two adjacent light emitting cells 100.

The bridge electrode 150 may be formed to include the same material to the first electrode 130 and the second electrode 140. For example, the bridge electrode 150 may include a conductive material, for example, at least one of Mo, Cr, Ni, Au, Al, Ti, Pt, V, W, Pd, Cu, Rh, or Ir and have a single or multiple layer structure.

The insulating layer 160 is disposed on the side face of the light emitting structure 130. The insulating layer 160 may be disposed between the light emitting cells 100 and the bridge electrode 150.

The insulating layer 160 may function to isolate adjacent light emitting cells 100 electrically, or isolate the bridge electrode 150 from the light emitting cells 100 electrically. The electrical short between the adjacent light emitting cells 100 may be prevented by the insulating layer 160. The electrical short between the first conductive semiconductor layer 122 and the second conductive semiconductor layer 126 in one light emitting cell may be prevented by the insulating layer 160.

The insulating layer 160 may be formed of non-conductive oxide layer or nitride layer, for example silicon oxide layer $SiO_2$, nitride oxide layer, or aluminium oxide layer, the disclosure is not limited thereto.

The thickness of the bridge electrode 150 may not be uniform. The bridge electrode 150 may have a part thicker than the first electrode 130 and the second electrode. Namely, the part of the bridge electrode 150 may be thicker than the first electrode 130 and the second electrode.

The bridge electrode 150 may include a first part 151 contacting the first electrode 130 in one of two adjacent light emitting cells 100, a second part 152 contacting the second electrode 140 in the other of two adjacent light emitting cells 100, and a third part 153 disposed between the first part 151 and the second part 152. The bridge electrode 150 may further include a fourth part 154 disposed on the side faces of two adjacent light emitting cells to connect the first part 151 to the third part 153 electrically or connect the second part 152 to the third part 153 electrically.

The first part 151 may contact the first electrode 130 in one of two adjacent light emitting cells 100 and be disposed on the first conductive semiconductor layer 122.

The second part 152 may contact the second electrode 140 in the other of two adjacent light emitting cells 100 and be disposed on the second conductive semiconductor layer 126.

The first part 151 may be disposed on the first conductive semiconductor layer 122 exposed by the etched region E of the light emitting structure 120. The first part 151 may disposed on both of the first electrode 130 in one of two adjacent light emitting cells 100 and the first conductive semiconductor layer 122.

The second part 152 may be disposed on the second electrode 140 in the other of two adjacent light emitting cells 100 and the second conductive semiconductor layer 126.

The third part 153 may be disposed between two adjacent light emitting cells 100 and disposed on the substrate 110. In other words, the third part 153 may be disposed on the space between two adjacent light emitting cells 100 on the substrate 110.

The fourth part 154 may be disposed on the side face of the light emitting cell between the first part 151 and the third part 153, and disposed on the side face of the light emitting cell between the second part 152 and the third part 153. The fourth part may connect the first part 151 to the third part 153 electrically and connect the second part 152 to the third part 153.

A thickness $T_{B3}$ of the third part 153 may be greater than a thickness $T_1$ of the first electrode 130 or a thickness $T_2$ of the second electrode 140. The thickness of the bridge electrode 150 may be not uniform totally and the thickness $T_{B3}$ of the third part 153 may be greater than a thickness of the first part 151 or a thickness of the second part 152.

A thickness $T_{B4}$ of the fourth part 154 may be equal to the thickness $T_1$ of the first part 151 or the thickness $T_2$ of the second part 152, or smaller than the thickness $T_{B1}$ of the first part 151 or the thickness $T_{B2}$ of the second part 152. The thickness $T_{B3}$ of the third part 153 may be greatest among other parts 151, 152, and 154.

In embodiments, the thickness of at least one portion of the bridge electrode may be thicker than the thickness of the first electrode 130 or the second electrode 140 to increase the area of the bridge electrode 150. Thereby it prevents deterioration in reliability of the light emitting device, such as the bridge electrode 150 being burned by current concentration on the bridge electrode having the narrow area.

In another embodiment, the thickness of the first part 151 or the thickness of the second part 152 may be equal to the thickness of the first electrode 130 or the thickness of the second electrode 140.

A height of the first part 151 may be equal to a height of the first electrode 130, and a height of the second part 152 may be equal to a height of the second electrode 140. Namely, the first part 151 may contact the first electrode 130 and an upper surface of the first part 151 may have no step with an upper surface of the first electrode 130. And the second part 152 may contact the second electrode 140 and an upper surface of the second part 152 may have no step with an upper surface of the second electrode 140.

Referring to FIG. 1, the second electrode 140 of a light emitting cell 100Z$_1$ may include the second electrode pad 140P to secure area for wire bonding. For example, the light emitting cell 100Z$_1$ may be disposed in one edge of light emitting cells arrangement. Similarly, the first electrode 130 of a light emitting cell 100Z$_2$ may include the first electrode pad 130P to secure area for wire bonding. For example, the light emitting cell 100Z$_2$ may be disposed in another edge of light emitting cells arrangement.

Figure 4:
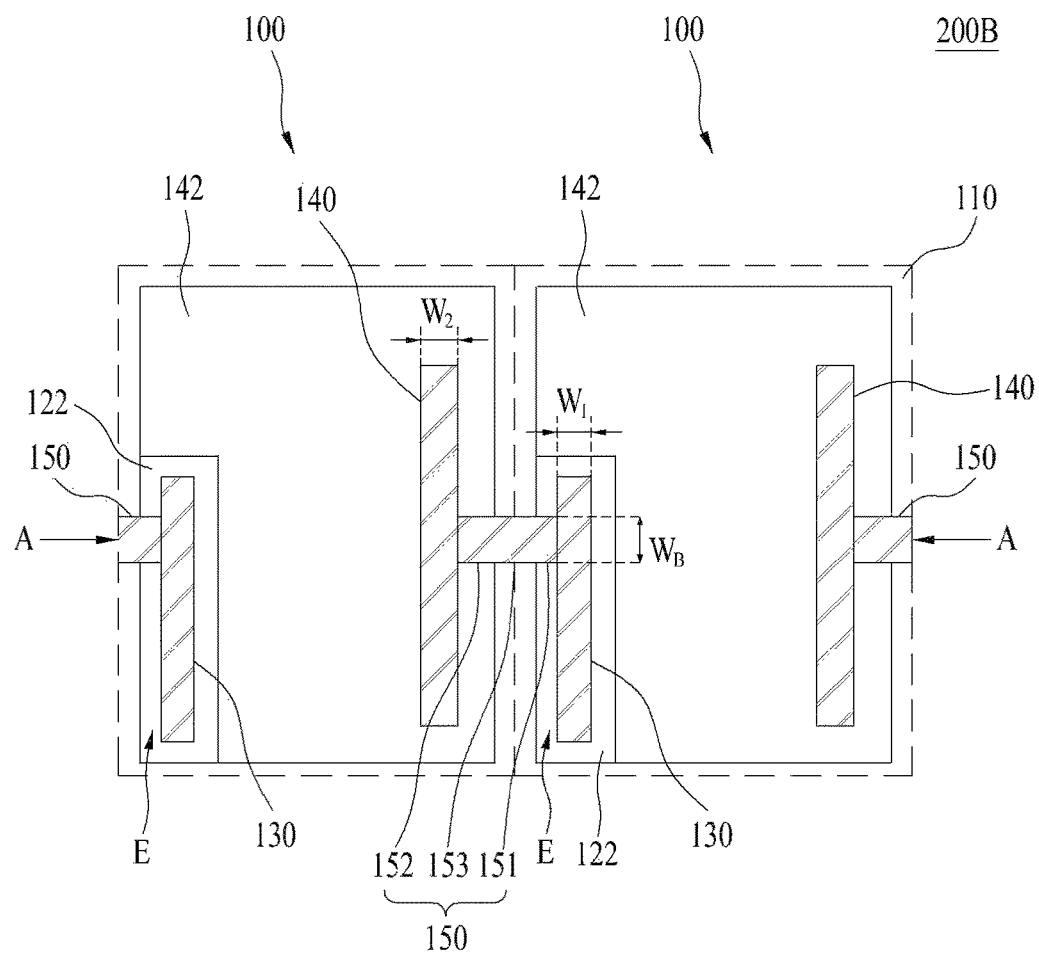
FIG. 4 is an enlarged plan view of a part of the light emitting device according to a second embodiment.

FIG. 4 is an enlarged plan view of a part of the light emitting device according to a second embodiment. Identical reference numerals represent identical configurations and the contents described above are omitted or summarized. A sectional view taken along the direction AA is equal to FIG. 3, FIG. 3 may be referred together.

Referring to FIG. 4, the light emitting device 200B may include a plurality of the light emitting cells 100 and the bridge electrode 150 electrically connecting two adjacent light emitting cells each other. The thickness of the bridge electrode 150 may not be uniform totally. The bridge electrode 150 may have a portion thicker than the first electrode 130 or the second electrode 140.

The bridge electrode 150 may include a first part 151 contacting the first electrode 130 in one of two adjacent light emitting cells 100, a second part 152 contacting the second electrode 140 in the other of two adjacent light emitting cells 100, and a third part 153 disposed between the first part 151 and the second part 152. The bridge electrode 150 may further include a fourth part 154 disposed on the side faces of two adjacent light emitting cells to connect the first part 151 to the third part 153 electrically or connect the second part 152 to the third part 153 electrically.

A thickness T$_{B3}$ of the third part 153 may be greater than the thickness T$_1$ of the first electrode 130 or the thickness T$_2$ of the second electrode 140. The thickness of the bridge electrode 150 may be not uniform totally and the thickness T$_{B3}$ of the third part 153 may be greater than the thickness T$_1$ of the first part 151 or the thickness T$_3$ of the second part 152.

A thickness T$_{B4}$ of the fourth part 154 may be equal to the thickness T$_1$ of the first part 151 or the thickness T$_2$ of the second part 152, or smaller than the thickness T$_{B1}$ of the first part 151 or the thickness T$_{B2}$ of the second part 152. The thickness T$_{B3}$ of the third part 153 may be greatest among other parts 151, 152, and 154.

The difference between the first embodiment 200A and the second embodiment 200B is that a width W$_B$ of bridge electrode 150 in the second embodiment 200B is greater than a width W1 of the first electrode 130, or a width W$_2$ of the second electrode 140.

The width W$_B$ of bridge electrode 150 may be 25 μm~35 μm. For example, The width W$_B$ of bridge electrode 150 may be 30 μm. The width W1 of the first electrode 130, or the width W$_2$ of the second electrode 140 may be 5 μm~10 μm. For example, The width W1 of the first electrode 130, or the width W$_2$ of the second electrode 140 may be 7 μm, and the width W1 of the first electrode 130 may be smaller than or equal to the width W$_2$ of the second electrode 140.

In second embodiment, the width W$_B$ of the bridge electrode 150 may be greater than the width W1 of the first electrode 130 or the width W2 of the second electrode 140 and thereby the area of the bridge electrode 150 may be increased. By increasing the area of the bridge electrode 150, the reliability of the light emitting device may be improved and disconnection of the bridge electrode 150 may be prevented. In addition, optical absorption caused by increasing the width W$_B$ of the bridge electrode 150 may be minimized because the bridge electrode 150 is disposed on the edge region of the light emitting cell.

Figure 5:
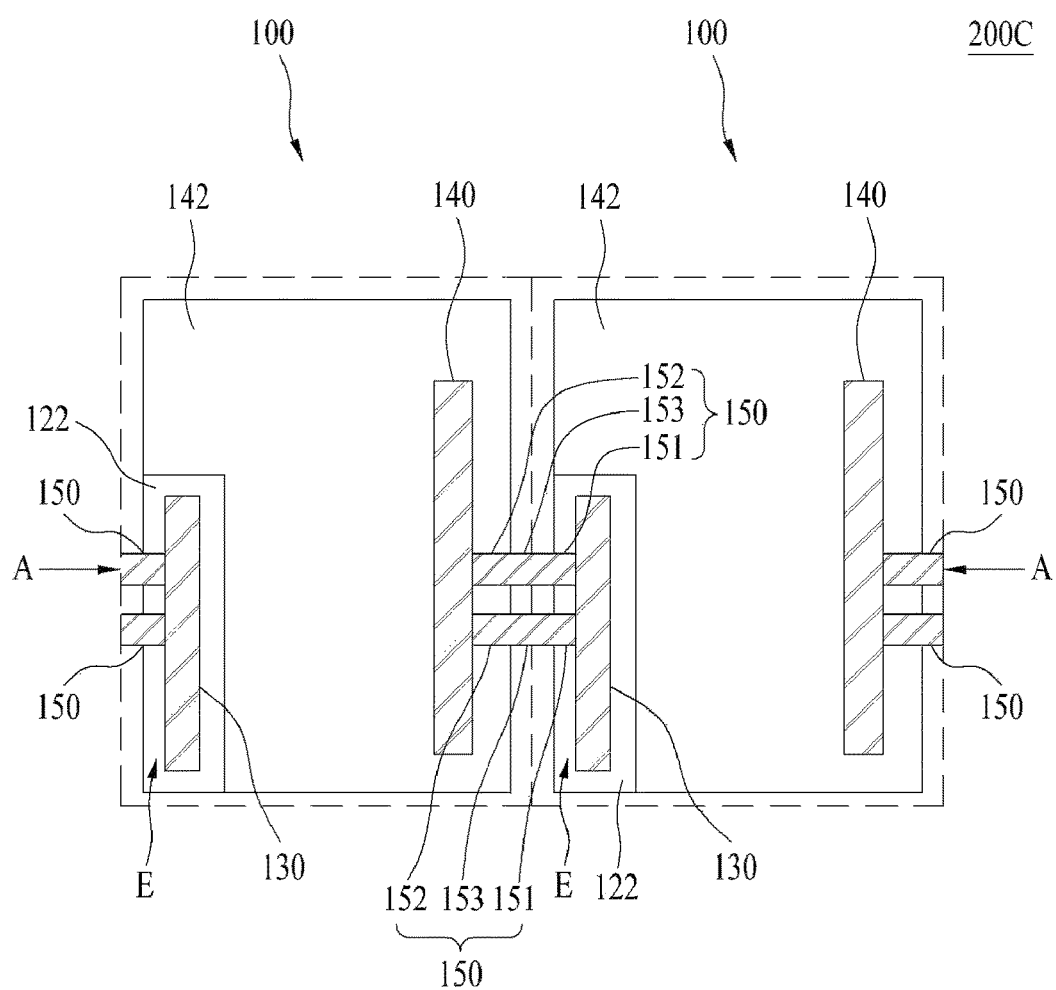
FIG. 5 is an enlarged plan view of a part of the light emitting device according to a third embodiment.

FIG. 5 is an enlarged plan view of a part of the light emitting device according to a third embodiment. The contents described above are omitted or summarized. A sectional view of FIG. 5 taken along the direction AA is equal to FIG. 3, FIG. 3 may be referred together.

Referring to FIG. 5, a light emitting device 200C may include a plurality of the light emitting cells 100 and the bridge electrode 150 electrically connecting two adjacent light emitting cells each other.

The difference between the third embodiment 200C and the first embodiment 200A is that in the third embodiment 200C, a plurality of bridge electrodes 150 may be disposed between adjacent light emitting cells. For example, two bridge electrodes 150 may be disposed and spaced from each other between two adjacent light emitting cells 100.

A width of each of two bridge electrodes 150 spaced from each other may be greater than the width of the first electrode 130 or the width of the second electrode 140.

A width of each of two bridge electrodes 150 spaced from each other may be 15 μm~25 μm. For example, a width of each of two bridge electrodes 150 may be 20 μm. The width of the first electrode 130 or the width of the second electrode 140 thereof may be the same as described in FIG. 4.

The thickness of the bridge electrode 150 may not be uniform totally. Each of the bridge electrodes 150 in FIG. 5 may have a portion thicker than the first electrode 130 or the second electrode 140.

Each of the bridge electrodes 150 in FIG. 5 may include a first part 151 contacting the first electrode 130 in one of two adjacent light emitting cells 100, a second part 152 contacting the second electrode 140 in the other of two adjacent light emitting cells 100, and a third part 153 disposed between the first part 151 and the second part 152. Each of the bridge electrodes 150 in FIG. 5 may further include a fourth part 154 disposed on the side faces of two adjacent light emitting cells to connect the first part 151 to the third part 153 electrically or connect the second part 152 to the third part 153 electrically.

A thickness T$_{B3}$ of the third part 153 in FIG. 5 may be greater than the thickness T$_1$ of the first electrode 130 or the thickness T$_2$ of the second electrode 140. The thickness of each of the bridge electrodes 150 in FIG. 5 may be not uniform totally and the thickness T$_{B3}$ of the third part 153 in FIG. 5 may be greater than the thickness T$_{B1}$ of the first part 151 or the thickness T$_{B2}$ of the second part 152.

A thickness T$_{B4}$ of the fourth part 154 in FIG. 5 may be equal to the thickness T$_{B1}$ of the first part 151 or the thickness T$_{B2}$ of the second part 152, or smaller than the thickness T$_{B1}$ of the first part 151 or the thickness T$_{B2}$ of the second part 152. The thickness T$_{B3}$ of the third part 153 in FIG. 5 may be greatest among other parts 151, 152, and 154.

In the third embodiment, the total area for the bridge electrode may be increased by disposing the plurality of bridge electrodes 150 in FIG. 5 between two adjacent light emitting cells. Even if one of the bridge electrodes 150 is disconnected, other bridge electrode may connect two adjacent light emitting cells each other, and thereby the reliability of the light emitting device may be improved. In addition, optical absorption caused by increasing a number of the bridge electrodes may be minimized because the bridge electrodes 150 are disposed on the edge region of the light emitting cell.

Figure 6:
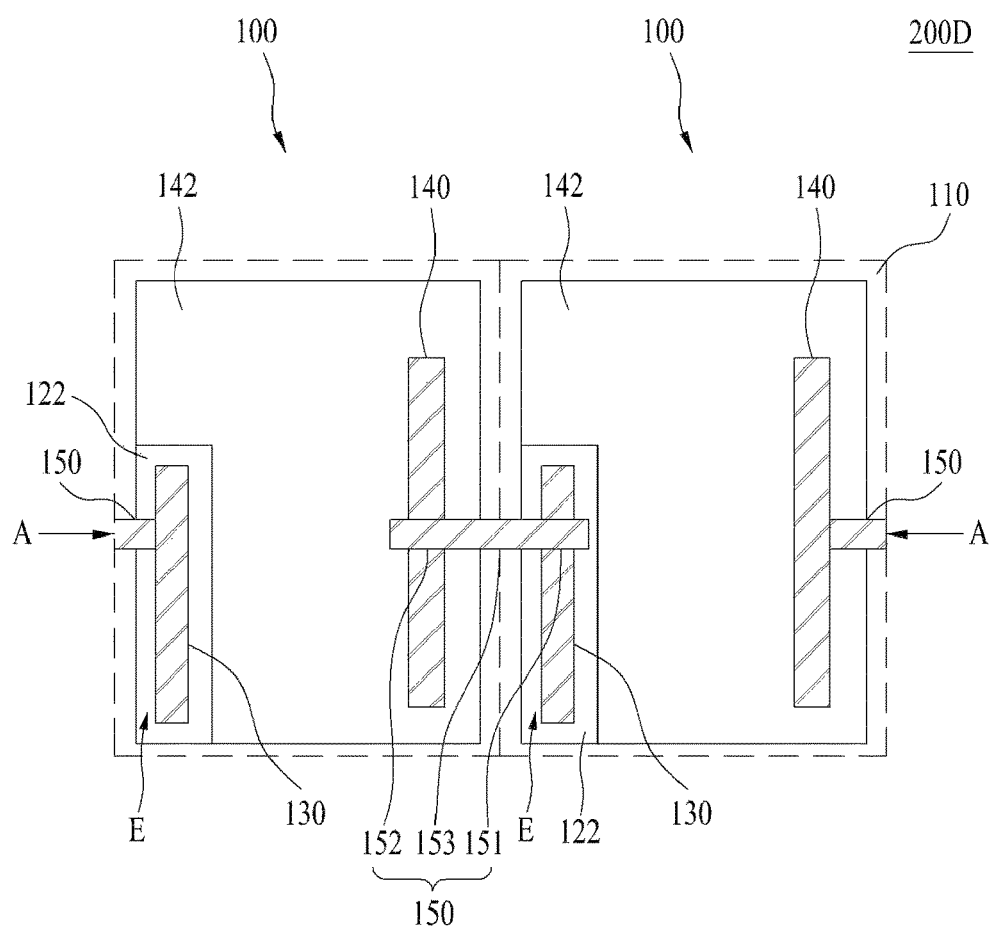
FIG. 6 is an enlarged plan view of a part of the light emitting device according to a fourth embodiment.
Figure 7:
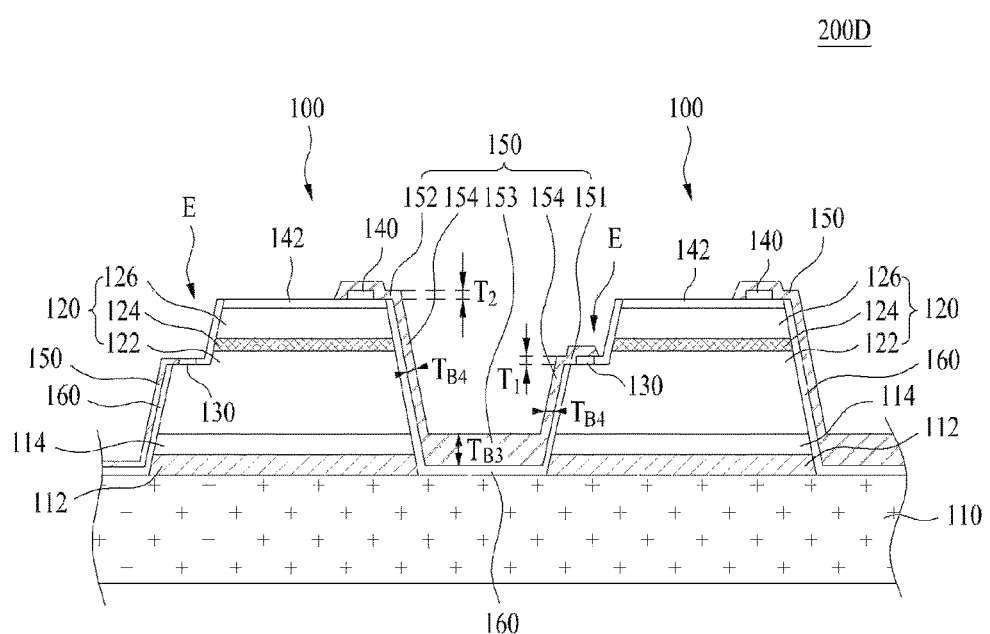
FIG. 7 is a sectional view taken along the direction AA.

FIG. 6 is an enlarged plan view of a part of the light emitting device according to a fourth embodiment, and FIG. 7 is a sectional view taken along the direction AA. The contents described above are omitted or summarized.

Referring to FIG. 6 and FIG. 7, a light emitting device 200 D may include a plurality of the light emitting cells 100 and the bridge electrode 150 electrically connecting two adjacent light emitting cells each other.

The thickness of the bridge electrode 150 in FIG. 6 may not be uniform totally. The bridge electrode 150 in FIG. 6 may have a portion thicker than the first electrode 130 or the second electrode 140.

The bridge electrode 150 in FIG. 7 may include a first part 151 contacting the first electrode 130 in one of two adjacent light emitting cells 100, a second part 152 contacting the second electrode 140 in the other of two adjacent light emitting cells 100, and a third part 153 disposed between the first part 151 and the second part 152. The bridge electrode 150 may further include a fourth part 154 disposed on the side faces of two adjacent light emitting cells to connect the first part 151 to the third part 153 electrically or connect the second part 152 to the third part 153 electrically.

The first part 151 in FIG. 7 may contact an upper surface of the first electrode 130 in one of two adjacent light emitting cells 100. Namely, one portion of the first part 151 may be disposed on the first conductive semiconductor layer 122 in one of two adjacent light emitting cells 100 and another portion of the first part 151 may be disposed on the first electrode 130 in the one of two adjacent light emitting cells 100.

The second part 152 in FIG. 7 may contact an upper surface of the second electrode 140 in the other of two adjacent light emitting cells 100. Namely, one portion of the second part 152 may be disposed on the second conductive semiconductor layer 126 in the other of two adjacent light emitting cells 100 and another portion of the second part 152 may be disposed on the second electrode 130 in the other of two adjacent light emitting cells 100.

A thickness $T_{B3}$ of the third part 153 in FIG. 7 may be greater than the thickness $T_1$ of the first electrode 130 or the thickness $T_2$ of the second electrode 140. The thickness of the bridge electrode 150 in FIG. 7 may be not uniform totally and the thickness $T_{B3}$ of the third part 153 in FIG. 7 may be greater than the thickness $T_{B1}$ of the first part 151 or the thickness $T_{B2}$ of the second part 152.

A thickness $T_{B4}$ of the fourth part 154 in FIG. 7 may be equal to the thickness $T_{B1}$ of the first part 151 or the thickness $T_{B2}$ of the second part 152, or smaller than the thickness $T_{B1}$ of the first part 151 or the thickness $T_{B2}$ of the second part 152. The thickness $T_{B3}$ of the third part 153 in FIG. 7 may be greatest among other parts 151, 152, and 154.

In fourth embodiment, the area of a portion of the bridge electrode 150 contacting the first and second electrodes 130 and 140 of the light emitting cells having a high resistance may be increased, and thereby it prevents deterioration in reliability of the light emitting device, such as the bridge electrode 150 being burned by current concentration on the bridge electrode having the narrow area.

Figure 8:
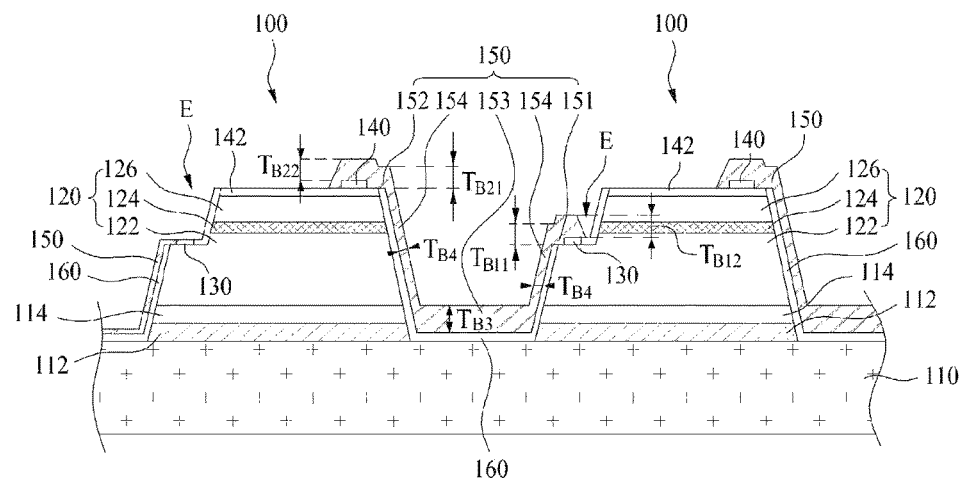
FIG. 8 is a sectional view according to a fifth embodiment taken along the direction AA.

FIG. 8 is a sectional view according to a fifth embodiment taken along the direction AA. The contents described above are omitted or summarized. A plan view of FIG. 8 is equal to FIG. 6, FIG. 6 may be referred together.

Referring to FIG. 8, a light emitting device 200E may include a plurality of the light emitting cells 100 and the bridge electrode 150 electrically connecting two adjacent light emitting cells each other.

The bridge electrode 150 in FIG. 8 may include a first part 151 contacting the first electrode 130 in one of two adjacent light emitting cells 100, a second part 152 contacting the second electrode 140 in the other of two adjacent light emitting cells 100, and a third part 153 disposed between the first part 151 and the second part 152.

The bridge electrode 150 in FIG. 8 may further include a fourth part 154 disposed on the side faces of two adjacent light emitting cells to connect the first part 151 to the third part 153 electrically or connect the second part 152 to the third part 153 electrically.

The first part 151 in FIG. 8 may contact an upper surface of the first electrode 130 and at least one side face of the first electrode 130. The first part 151 in FIG. 8 may be disposed to surround the first electrode 130. And the second part 152 in FIG. 8 may contact an upper surface of the first electrode 130 and at least one side face of the second electrode 140. The second part 152 in FIG. 8 may be disposed to surround the second electrode 140.

A thickness $TB_{11}$ of one portion of the first part 151 disposed on the first conductive semiconductor layer 122 may be substantially equal to a thickness $TB_{12}$ of another portion of the first part 151 disposed on the first electrode 130.

A thickness $TB_{21}$ of one portion of the second part 152 disposed on the second conductive semiconductor layer 126 may be substantially equal to a thickness $TB_{22}$ of another portion of the second part 152 disposed on the second electrode 140.

Figure 9:
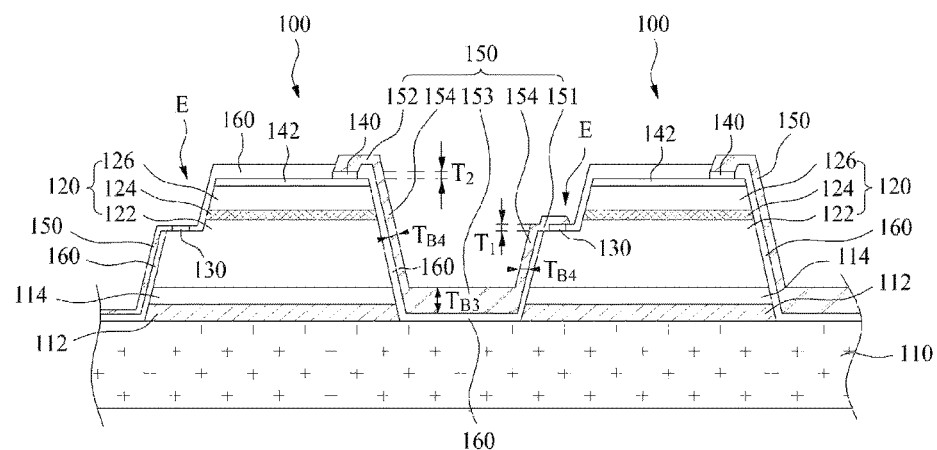
FIG. 9 is a sectional view according to a sixth embodiment taken along the direction AA.

FIG. 9 is a sectional view according to a sixth embodiment taken along the direction AA. The contents described above are omitted or summarized.

Referring to FIG. 9, a light emitting device 200F may include a plurality of the light emitting cells 100 and the bridge electrode 150 electrically connecting two adjacent light emitting cells each other.

A passivation layer 160 may be disposed on a surface of the light emitting device 200F except connection parts electrically connecting the bridge electrode 150 to the first electrode 130 and the second electrode 140.

Figure 10:
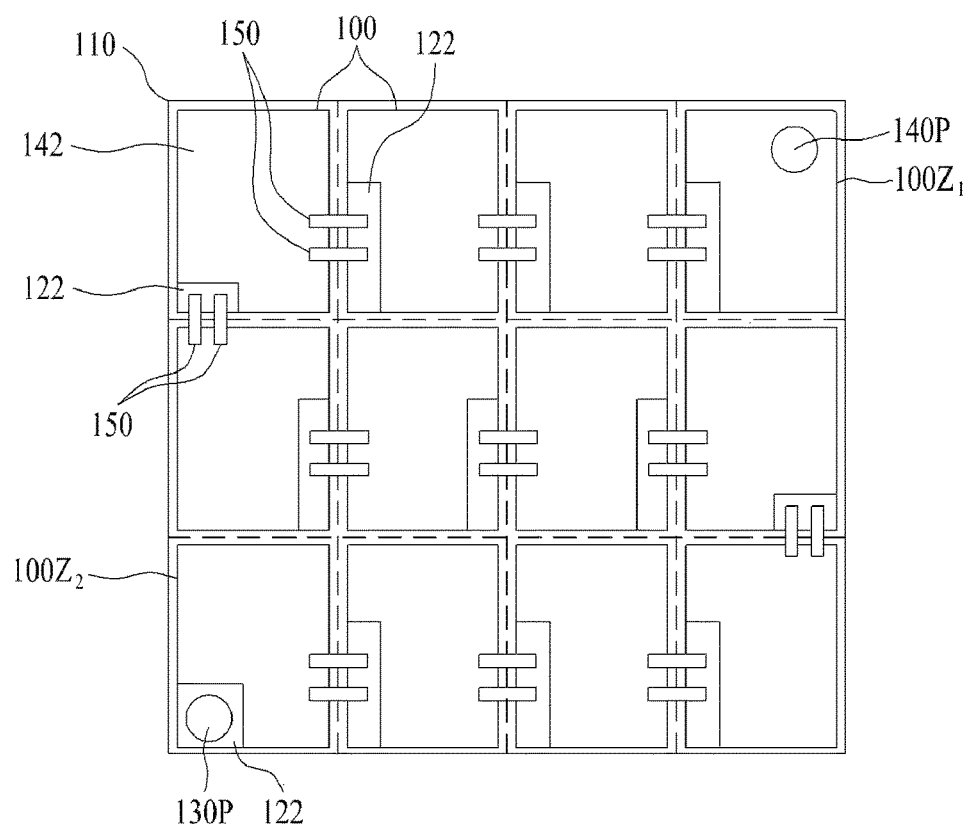
FIG. 10 is a plan view of a light emitting device according to a seventh embodiment.
Figure 11:
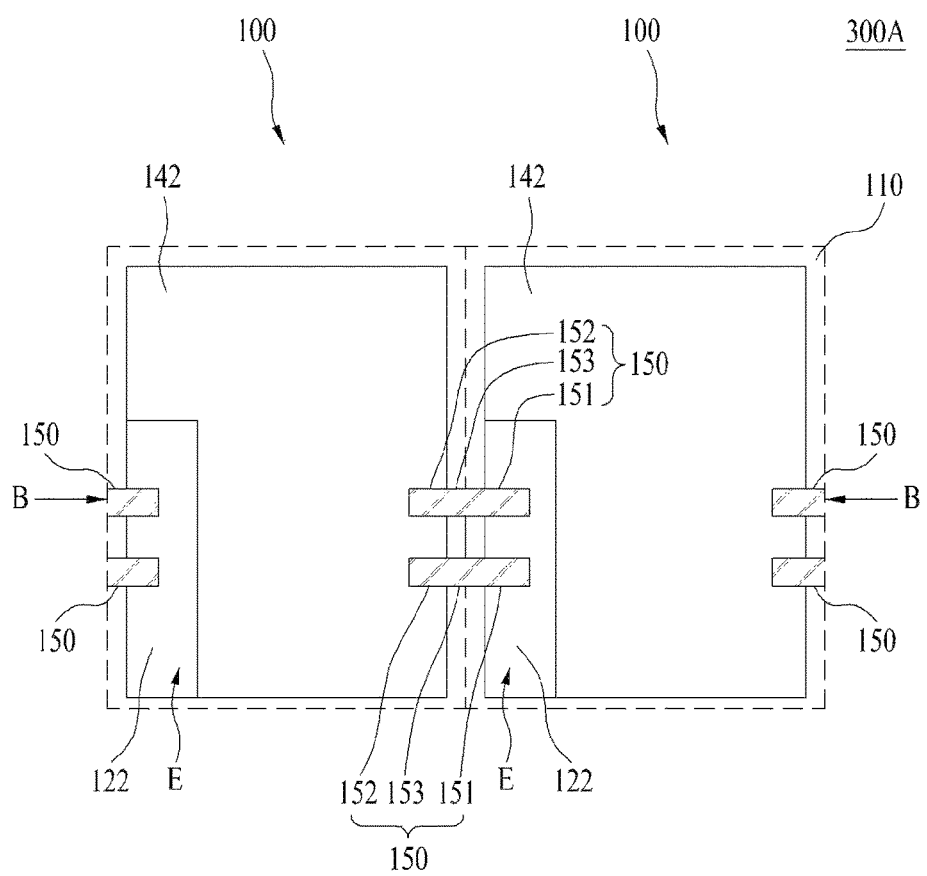
FIG. 11 is an enlarged plan view of a part of FIG. 10.
Figure 12:
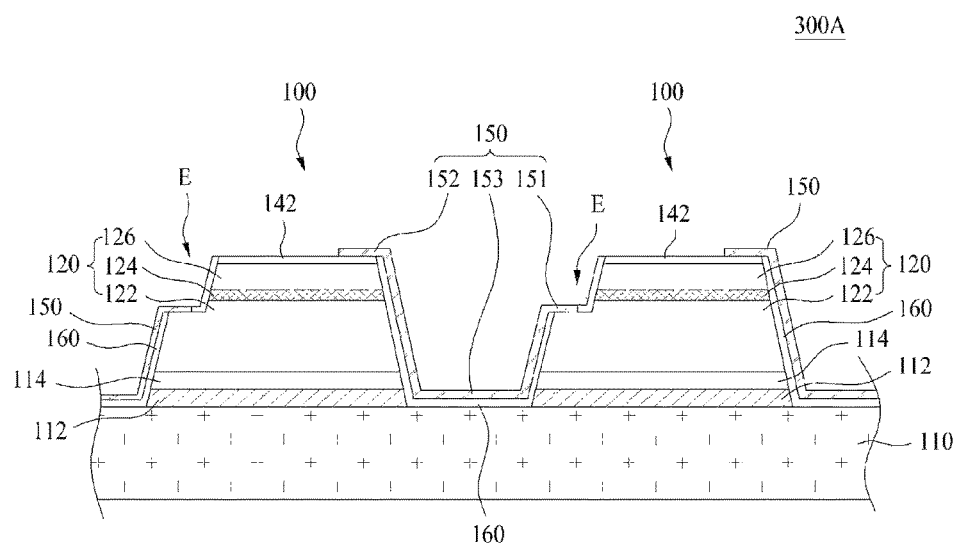
FIG. 12 is a front sectional view taken along the direction BB of FIG. 11.

FIG. 10 is a plan view of a light emitting device according to a seventh embodiment, and FIG. 11 is an enlarged plan view of a part of FIG. 10, and FIG. 12 is a front sectional view taken along the direction BB of FIG. 11. The contents described above are omitted or summarized.

Referring to FIG. 9 to FIG. 12, a light emitting device 300A may include a plurality of the light emitting cells 100 and the bridge electrode 150 electrically connecting two adjacent light emitting cells each other.

The substrate 110 may be disposed under the plurality of the light emitting cells 100. The plurality of the light emitting cells 100 may be supported by the substrate 110, and spaced away from each other.

The plurality of the bridge electrodes 150 may be disposed between two adjacent light emitting cells 100. The plurality of the bridge electrodes 150 may electrically connect two adjacent light emitting cells 100 each other.

The plurality of the bridge electrodes 150 may electrically connect the first conductive semiconductor layer 122 in one of two adjacent light emitting cells 100 to the second conductive semiconductor layer 126 in the other of two adjacent light emitting cells 100.

In seventh embodiment, the total area for the bridge electrode may be increased by disposing the plurality of bridge electrodes 150 in FIG. 11 between two adjacent light emitting cells. Even if one of the bridge electrodes 150 in FIG. 11 is disconnected, other bridge electrode may connect two adjacent light emitting cells each other, and thereby the reliability of the light emitting device may be improved.

Each of the bridge electrodes 150 in FIG. 11 may include a first part 151 on the first conductive semiconductor layer 122 in one of two adjacent light emitting cells 100, a second part 152 on the second conductive semiconductor layer 126 in the other of two adjacent light emitting cells 100, and a third part 153 between the first part 151 and the second part 152. The first part 151 in FIG. 11 may be disposed on the first conductive semiconductor layer 122 exposed by the etched region of the light emitting structure 120.

The third part 153 may be disposed between two adjacent light emitting cells 100, and disposed on the substrate. Namely, the third part 153 may be disposed on the space between two adjacent light emitting cells 100 on the substrate 110.

The portions of the bridge electrode 150 between the first part 151 and the third part 153 and between the second part 152 and the third part 153 may be disposed on the side face of the light emitting structure 120.

In seventh embodiment, the bridge electrode 150 may directly connect the first conductive semiconductor layer 122 in one of two adjacent light emitting cells 100 to the second conductive semiconductor layer 126 in the other of two adjacent light emitting cells 100 without the extra first and second electrodes. Namely the first part 151 of the bridge electrode 150 may contact the first conductive semiconductor layer 122 in one of two adjacent light emitting cells 100, and the second part 152 of the bridge electrode 150 may contact the second conductive semiconductor layer 126 in the other of two adjacent light emitting cells 100.

Referring to FIG. 10, the light emitting cell $100Z_1$ disposed in one edge of the light emitting cells arrangement may include the second electrode pad 140P on the second conductive semiconductor layer 126 to secure area for wire bonding. Similarly, the light emitting cell $100Z_2$ disposed in another edge of the light emitting cells arrangement may include the first electrode pad 130P on the first conductive semiconductor layer 122 to secure area for wire bonding.

Figure 13:
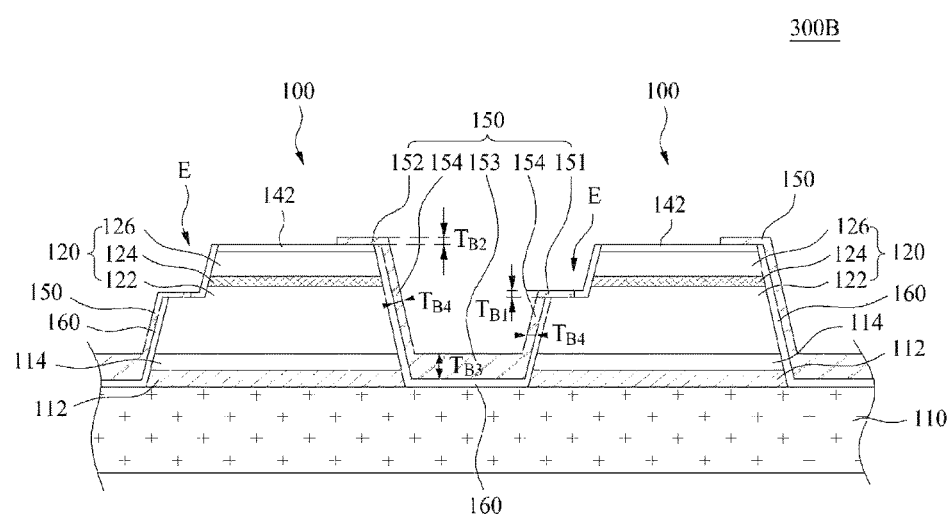
FIG. 13 is a sectional view of a light emitting device according to an eighth embodiment taken along the direction BB.

FIG. 13 is a sectional view of a light emitting device according to an eighth embodiment taken along the direction BB. The contents described above are omitted or summarized. A plan view of FIG. 13 is equal to FIG. 11, FIG. 11 may be referred together.

Referring to FIG. 13, a light emitting device 300B may include a plurality of the light emitting cells 100 and the bridge electrode 150 electrically connecting two adjacent light emitting cells each other.

The difference between the eighth embodiment 300B and the seventh embodiment 300A is that a thickness of the bridge electrode 150 in the eighth embodiment 300B is not uniform totally.

The bridge electrode 150 in FIG. 13 may include a first part 151 on the first conductive semiconductor layer 122 in one of two adjacent light emitting cells 100, a second part 152 on the second conductive semiconductor layer 126 in the other of two adjacent light emitting cells 100, and a third part 153 between the first part 151 and the second part 152.

The bridge electrode 150 in FIG. 13 may further include a fourth part 154 disposed on the side faces of two adjacent light emitting cells to connect the first part 151 to the third part 153 electrically or connect the second part 152 to the third part 153 electrically. The first part 151 in FIG. 13 may be disposed on the first conductive semiconductor layer 122 exposed by the etched region of the light emitting structure 120.

The third part 153 in FIG. 13 may be disposed between two adjacent light emitting cells 100, and disposed on the substrate. Namely, the third part 153 may be disposed on the space between two adjacent light emitting cells 100 on the substrate 110.

The fourth part 154 may be disposed on the side faces of two adjacent light emitting cells 110 between the first part 151 and the third part 153, and between the second part 152 and the third part 153. The fourth part 154 may connect the first part 151 to the third part 153 electrically and connect the second part 152 to the third part 153 electrically.

The thickness $T_{B3}$ of the third part 153 may be greater than a thickness $TB_1$ of the first part 151 or a thickness $TB_2$ of the second part 152. A thickness $T_{B4}$ of the fourth part 154 may be equal to or smaller than the thickness $T_{B1}$ of the first part 151 or the thickness $T_{B2}$ of the second part 152. The thickness $T_{B3}$ of the third part 153 may be greatest among other parts 151, 152, and 154.

In eighth embodiments, at least one part of the bridge electrode 150 may be formed thickly to increase the area of the bridge electrode 150. Thereby it prevents deterioration in reliability of the light emitting device, such as the bridge electrode 150 being burned by current concentration on the bridge electrode having the narrow area.

Figure 14:
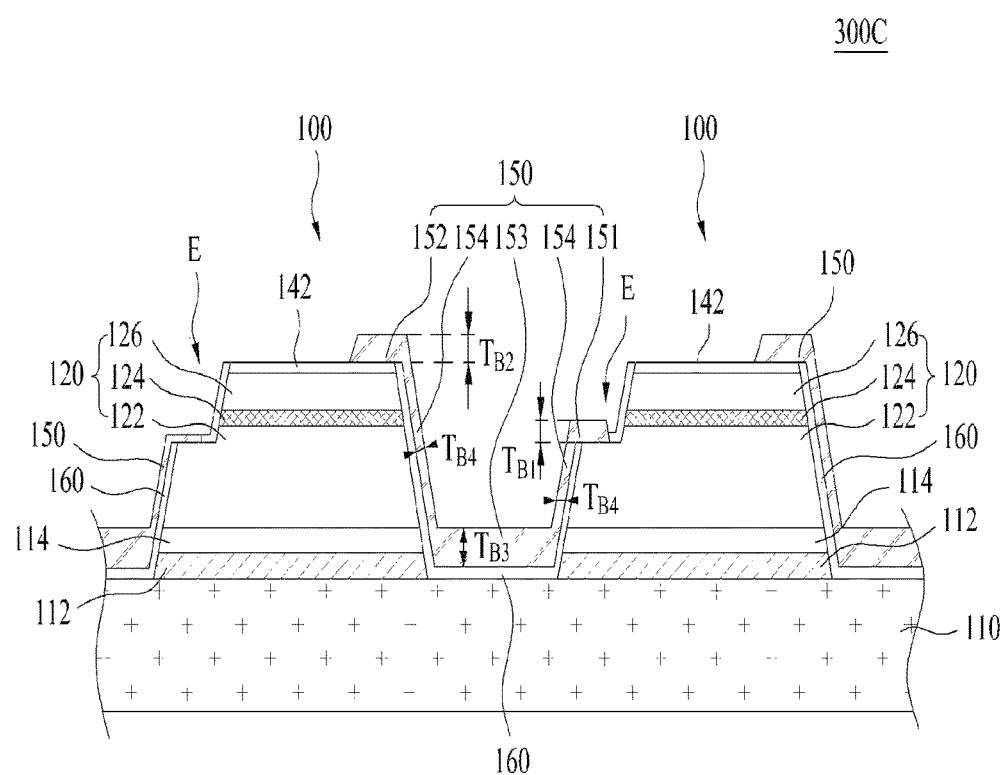
FIG. 14 is a sectional view of a light emitting device according to a ninth embodiment taken along the direction BB.

FIG. 14 is a sectional view of a light emitting device according to a ninth embodiment taken along the direction BB. The contents described above are omitted or summarized. A plan view of FIG. 14 is equal to FIG. 11, FIG. 11 may be referred together.

Referring to FIG. 14, a light emitting device 300C may include a plurality of the light emitting cells 100 and the bridge electrode 150 electrically connecting two adjacent light emitting cells each other.

The bridge electrode 150 in FIG. 14 may include a first part 151 on the first conductive semiconductor layer 122 in one of two adjacent light emitting cells 100, a second part 152 on the second conductive semiconductor layer 126 in the other of two adjacent light emitting cells 100, and a third part 153 between the first part 151 and the second part 152.

The bridge electrode 150 in FIG. 14 may further include a fourth part 154 disposed on the side faces of two adjacent light emitting cells to connect the first part 151 to the third part 153 electrically or connect the second part 152 to the third part 153 electrically. The first part 151 in FIG. 13 may be disposed on the first conductive semiconductor layer 122 exposed by the etched region of the light emitting structure 120.

The difference between the ninth embodiment 300C and the eighth embodiment 300B is that a thickness $T_{B1}$ of the first part 151 or a thickness $T_{B2}$ of the second part 152 in the ninth embodiment 300C is greater than a thickness $T_{B4}$ of the fourth part 154.

The thickness $T_{B1}$ of the first part 151 or the thickness $T_{B2}$ of the second part 152 in the ninth embodiment 300C may be smaller than or similar to a thickness $T_{B3}$ of the third part 153.

In ninth embodiment, the area of a connection part having a high resistance may be increased, and thereby it prevents deterioration in reliability of the light emitting device. For example it may be prevented that the bridge electrode 150 is burned by current concentration on the bridge electrode having the narrow area. For example, the connection part may be contact region between the bridge electrode 150 and the first and second conductive semiconductor layers 122 and 126 of the light emitting cells.

Figure 15:
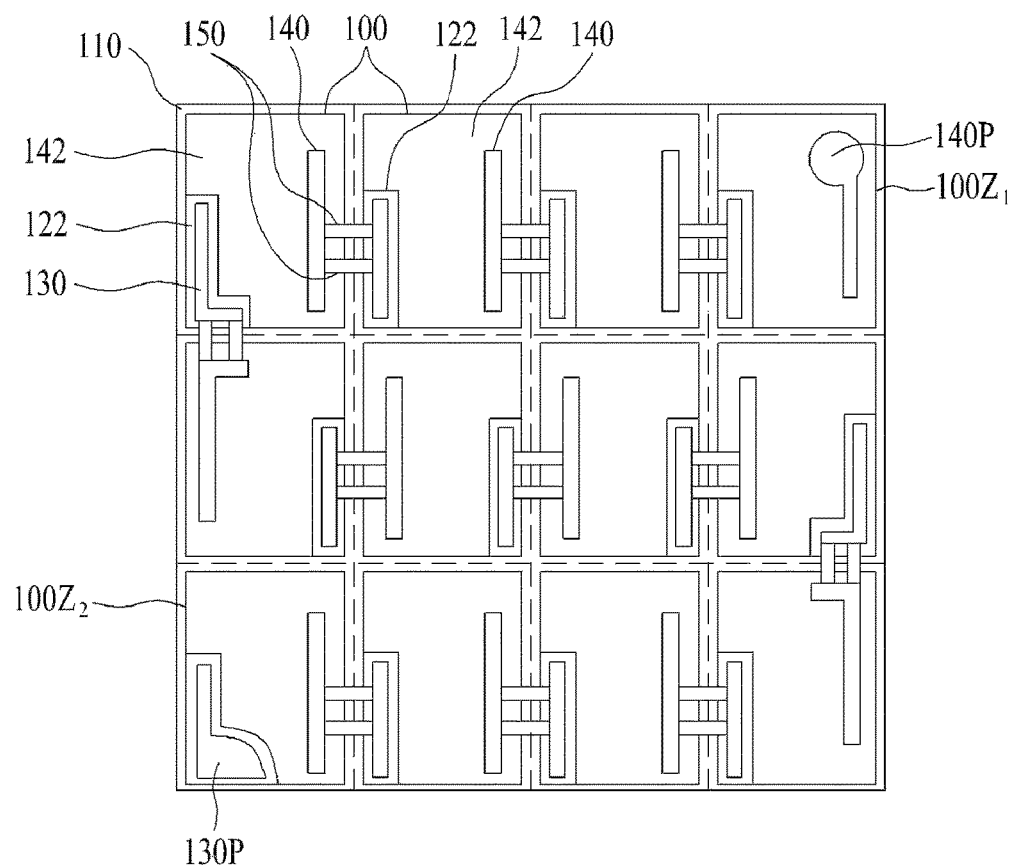
FIG. 15 is a plan view of a light emitting device according to tenth embodiment.
Figure 16:
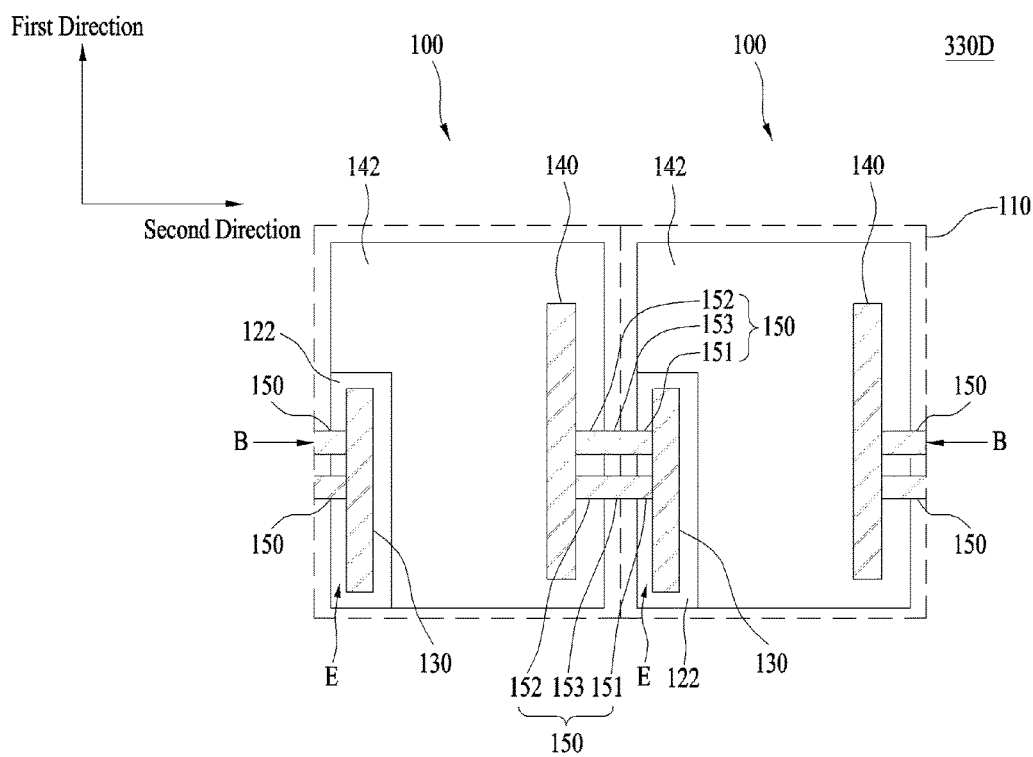
FIG. 16 is an enlarged plan view of a part of FIG. 15.
Figure 17:
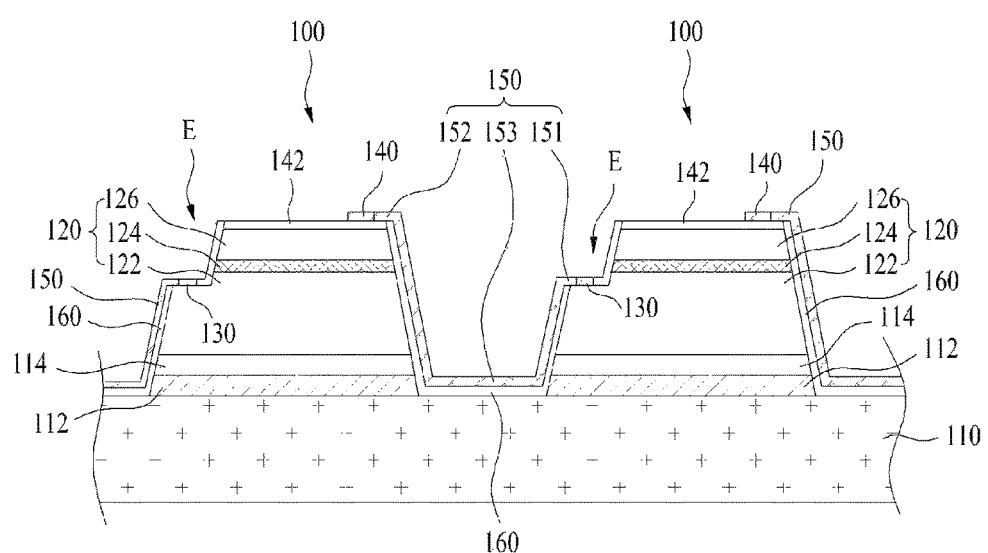
FIG. 17 is a sectional view of FIG. 16 taken along the direction BB.

FIG. 15 is a plan view of a light emitting device according to tenth embodiment, FIG. 16 is an enlarged plan view of a part of FIG. 15, and FIG. 17 is a sectional view of FIG. 16 taken along the direction BB. The contents described above are omitted or summarized.

Referring to FIG. 15 to FIG. 17, a light emitting device 300D may include a plurality of the light emitting cells 100 and the bridge electrode 150 electrically connecting two adjacent light emitting cells each other.

The substrate 110 may be disposed under the plurality of the light emitting cells 100. The plurality of the light emitting cells 100 may be supported by the substrate 110, and spaced away from each other. The bridge electrode may electrically connect two adjacent light emitting cells 100 each other.

The plurality of bridge electrodes 150 may be disposed between the first electrode 130 in one of two adjacent light emitting cells 100 and the second electrode 140 in the other of two adjacent light emitting cells 100, and spaced away from each other.

Each of the bridge electrodes 150 in FIG. 17 may include a first part 151 contacting the first electrode 130 in one of two adjacent light emitting cells 100, a second part 152 contacting the second electrode 140 in the other of two adjacent light emitting cells 100, and a third part 153 disposed between the first part 151 and the second part 152.

The first part 151 may be disposed on the first conductive semiconductor layer 122 and contact the first electrode 130 in one of two adjacent light emitting cells 100. The second part 152 may be disposed on the second conductive semiconductor layer 126 and contact the second electrode 140 in the other of two adjacent light emitting cells 100. The first part 151 may be disposed on the first semiconductor layer 122 exposed by the etched region E. The third part 153 in FIG. 17 may be disposed between two adjacent light emitting cells 100, and disposed on the substrate. Namely, the third part 153 may be disposed on the space between two adjacent light emitting cells 100 on the substrate 110.

The portions of the bridge electrode 150 between the first part 151 and the third part 153 and between the second part 152 and the third part 153 in FIG. 17 may be disposed on the side face of the light emitting structure 120.

Referring to FIG. 16, the first electrode 130 and the second electrode 140 may be disposed to have a first length direction. The plurality of the bridge electrodes 150 may have a second length direction. For example, the first length direction may be perpendicular to the second length direction.

The plurality of the bridge electrodes 150 having the second length direction may be disposed between the first electrode 130 having the first length direction and the second electrode 140 having the first length direction. For example, the first part 151 of each of the bridge electrodes 150 may contact the first electrode 130, and the second part 152 of each of the bridge electrodes 150 may contact the second electrode 140.

A thickness of the first part 151 in FIG. 17 may be equal to a thickness of the first electrode 130, and a thickness of the second part 152 may be equal to a thickness of the second electrode 140.

A height of the first part 151 in FIG. 17 may be equal to a height of the first electrode 130, and a height of the second part 152 may be equal to a height of the second electrode 140. Namely, the first part 151 in FIG. 17 may contact the first electrode 130 and an upper surface of the first part 151 may have no step with an upper surface of the first electrode 130. The second part 152 in FIG. 17 may contact the second electrode 140 and an upper surface of the second part 152 may have no step with an upper surface of the second electrode 140.

Referring to FIG. 15, the light emitting cell 100Z$_1$ disposed in one edge of the light emitting cells arrangement may include the second electrode pad 140P on the second conductive semiconductor layer 126 to secure area for wire bonding. Similarly, the light emitting cell 100Z$_2$ disposed in another edge of the light emitting cells arrangement may include the first electrode pad 130P on the first conductive semiconductor layer 122 to secure area for wire bonding.

Figure 18:
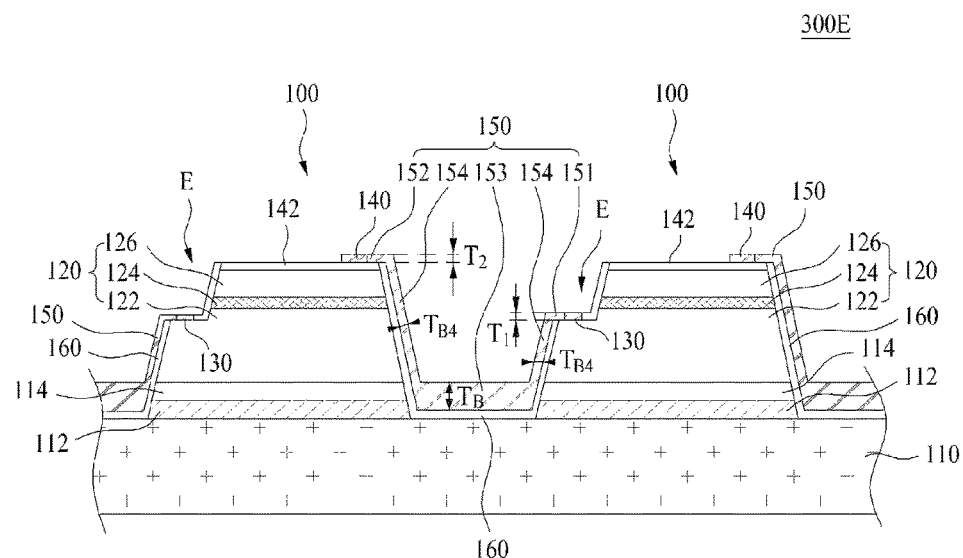
FIG. 18 is a sectional view of a light emitting device according to an eleventh embodiment taken along the direction BB.

FIG. 18 is a sectional view of a light emitting device according to an eleventh embodiment taken along the direction BB. The contents described above are omitted or summarized. A plan view of FIG. 18 is equal to FIG. 16, FIG. 16 may be referred together.

Referring to FIG. 18, a light emitting device 300E may include a plurality of the light emitting cells 100 and the bridge electrode 150 electrically connecting two adjacent light emitting cells each other.

The difference between the eleventh embodiment 300E and the tenth embodiment 300D is that a thickness of bridge electrode in the eleventh embodiment 300E is not uniform totally.

The bridge electrode 150 in FIG. 18 may include a first part 151 on the first conductive semiconductor layer 122 in one of two adjacent light emitting cells 100, a second part 152 on the second conductive semiconductor layer 126 in the other of two adjacent light emitting cells 100, and a third part 153 between the first part 151 and the second part 152.

The bridge electrode 150 in FIG. 18 may further include a fourth part 154 disposed on the side faces of two adjacent light emitting cells to connect the first part 151 to the third part 153 electrically or connect the second part 152 to the third part 153 electrically. The first part 151 in FIG. 13 may be disposed on the first conductive semiconductor layer 122 exposed by the etched region of the light emitting structure 120.

The third part 153 in FIG. 18 may be disposed between two adjacent light emitting cells 100, and disposed on the substrate. Namely, the third part 153 may be disposed on the space between two adjacent light emitting cells 100 on the substrate 110.

The fourth part 154 in FIG. 18 may be disposed on the side faces of two adjacent light emitting cells 110 between the first part 151 and the third part 153, and between the second part 152 and the third part 153. The fourth part 154 may connect the first part 151 to the third part 153 electrically and connect the second part 152 to the third part 153 electrically.

The thickness $T_{B3}$ of the third part 153 in FIG. 18 may be greater than a thickness $T_1$ of the first electrode 130 or a thickness $T_2$ of the second electrode 140. The thickness of the bridge electrode in FIG. 18 may be not uniform totally, and the thickness $T_{B3}$ of the third part 153 in FIG. 18 may be greater than a thickness $TB_1$ of the first part 151 or a thickness $TB_2$ of the second part 152.

A thickness $T_{B4}$ of the fourth part 154 in FIG. 18 may be equal to or smaller than the thickness $T_{B1}$ of the first part 151 or the thickness $T_{B2}$ of the second part 152. The thickness $T_{B3}$ of the third part 153 may be greatest among other parts 151, 152, and 154.

In eleventh embodiments, at least one part of the bridge electrode 150 may be formed thickly to increase the area of the bridge electrode 150. Thereby it prevents deterioration in reliability of the light emitting device, such as the bridge electrode 150 being burned by current concentration on the bridge electrode having the narrow area.

The thickness of the first part 151 or the thickness of the second part 152 may be equal to the thickness of the first electrode 130 or the thickness of the second electrode 140.

A height of the first part 151 may be equal to a height of the first electrode 130, and a height of the second part 152 may be equal to a height of the second electrode 140. Namely, the first part 151 may contact the first electrode 130 and an upper surface of the first part 151 may have no step with an upper surface of the first electrode 130. And the second part 152 may contact the second electrode 140 and an upper surface of the second part 152 may have no step with an upper surface of the second electrode 140.

Figure 19:
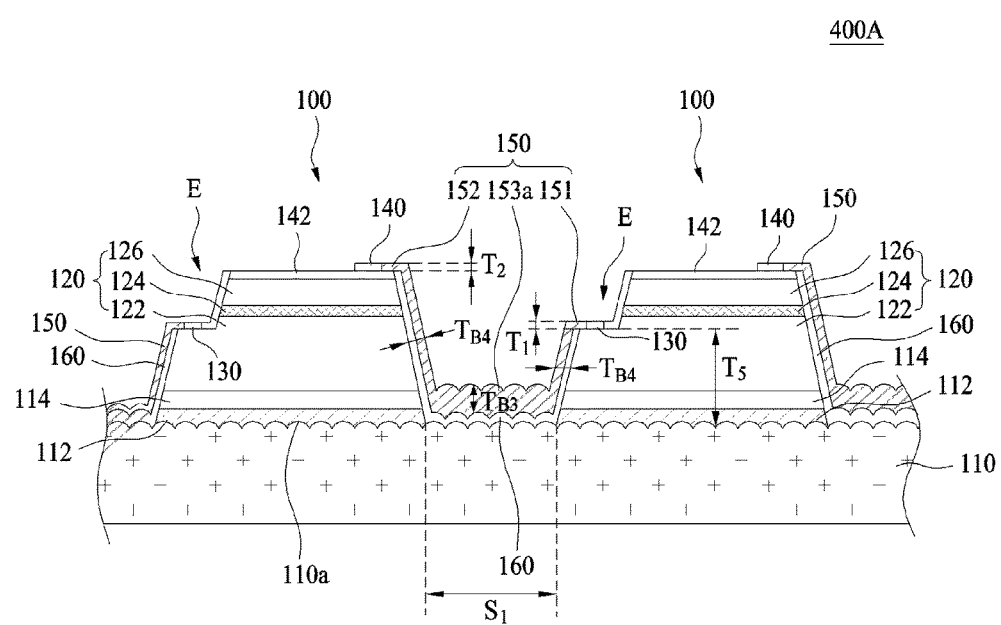
FIG. 19 is a sectional view of a light emitting device according to a twelfth embodiment.

FIG. 19 is a sectional view of a light emitting device 400A according to a twelfth embodiment. The contents described above are omitted or summarized.

Referring to FIG. 19, a roughness 110a may be formed on a surface of the substrate 110 to improve light extraction by scattering the light from the light emitting structure 120. For example, the substrate 110 may be a patterned sapphire Substrate. The roughness 110a may be additionally formed on one region (hereinafter, referred to as a first region(S1)) of an upper surface of the substrate 110 between adjacent light emitting cells 100.

A part of the insulating layer 160 disposed on the roughness 110a which is formed on the first region (S1) may have a curved surface. A shape of the curved surface may equal to that of outer periphery of the roughness 110a.

A roughness 153a corresponding to the roughness 110a of the substrate 110 may be formed on an upper surface of the third part 153 disposed on the insulating layer located in the first region S1 of the substrate 110.

The roughness 153a of the third part 153 may include a plurality of protruding parts protruded from the upper surface of the third part 153 of the bridge electrode 150.

A thickness $T_{B3}$ of the third part 153 may be greater than a thickness of the first part 151 of the bridge electrode 150 or a thickness of the second part 152 of the bridge electrode 150.

A thickness $T_{B3}$ of the third part 153 may be smaller than or equal to the sum of the thicknesses of the first part 151 and a first thickness. The first thickness may be the sum of thicknesses of the buffer layer 115, undoped semiconductor layer 114, and the etched region E of the light emitting structure 120. Namely, a height of an upper surface of the third part 153 with respect to an upper surface of the substrate may be lower than or equal to a height of an upper surface of the first part 151.

Figure 20:
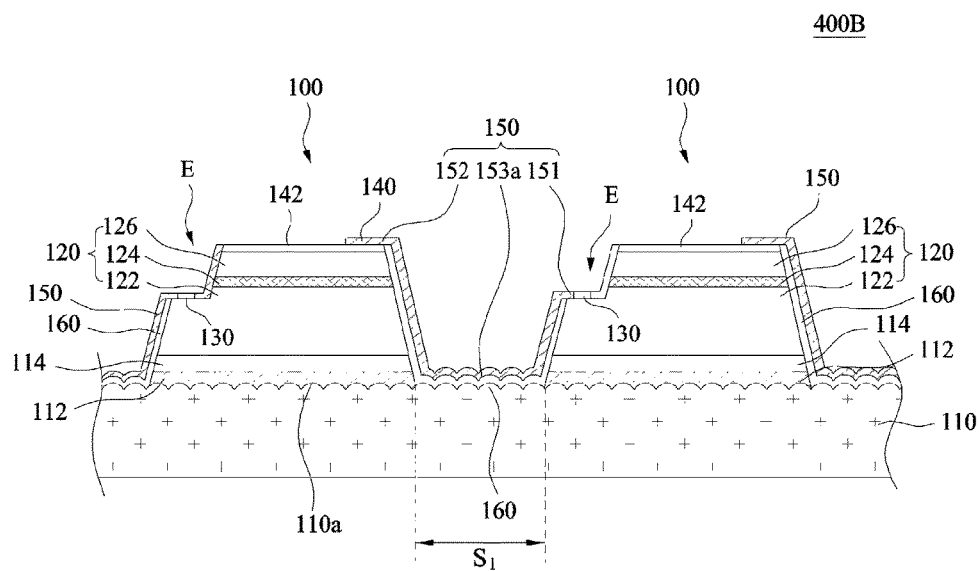
FIG. 20 is a sectional view of a light emitting device according to a thirteenth embodiment.

FIG. 20 is a sectional view of a light emitting device 400B according to a thirteenth embodiment. The contents described above are omitted or summarized.

Referring to FIG. 20, the third part 153 disposed on the insulating layer located in the first region S1 of the substrate 110 may comprise a roughness 153a corresponding to the roughness 110a of the substrate 110. The roughness 153a of the third part 153 may include a plurality of protruding parts protruded from the upper surface of the third part 153 of the bridge electrode 150.

The difference between the thirteenth embodiment 400B and the twelfth embodiment 400A is that the thicknesses of the first part 151, the second part 152, and the third part 153 in the thirteenth embodiment 400B are equal to each other.

Figure 21:
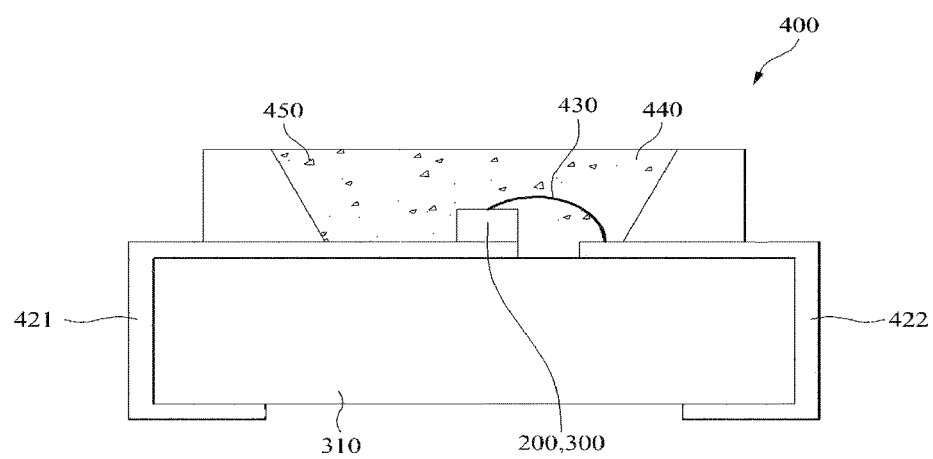
FIG. 21 illustrates a light emitting device package according to an embodiment.

FIG. 21 illustrates a light emitting device package according to an embodiment.

Referring to FIG. 21, the light emitting device package 400 includes a package body 310 having a cavity, a first and a second lead frames 421 and 422 on the package body, a light emitting devices 200, or 300 electrically connecting the first and the second lead frames 421 and 422, and a molding member 440 in the cavity of the package body 310. The light emitting device 200 or 300 may be realized in one chip including the plurality of light emitting cells 100 connected in series or in parallel.

The package body 310 may be provided at an upper surface thereof with a cavity. A side wall of the cavity may be inclined. The package body 310 shown in FIG. 21 has a cavity, but the disclosure is not limited thereto. In another embodiment, the package body may not have a cavity.

The package body 310 has a structure with a cavity at one side region thereof. Here, the side wall of the cavity may be inclined. The package body 310 may be formed of a substrate having excellent insulation and thermal conductivity, such as a silicon-based wafer level package, a silicon substrate, silicon carbide (SiC), aluminum nitride (AlN) or the like, and may have a structure in which plural substrates are stacked. The disclosure is not limited to the above-described material, structure and shape of the package body 310.

The package body 310 may be formed of a conductive material like a metal. If the package body 310 is formed of a conductive material like a metal, an insulating layer (not shown) may be coated on a surface of the package body 310 and prevent electrical short between the first and the second lead frames 421 and 422.

The first lead frame 421 and the second lead frame 422 are disposed on the surface of the package body 310 so as to be electrically separated from each other in consideration of heat discharge or mounting of the light emitting device 200 or 300. The first lead frame 421 and the second lead frame 422 may supply current to the light emitting device 200 or 300. The first lead frame 421 and the second lead frame 422 may reflect a light emitting from the light emitting device 200 or 300 to enhance light extraction efficiency.

The light emitting device 200 or 300 is disposed on the package body 310, the first lead frame 421 or the second lead frame 422. The light emitting device 200 or 300 is electrically connected to the first lead frame 421 and the second lead frame 422.

In FIG. 21, the first lead frame 421 directly connected to the light emitting device 200 or 300, and the second electrode 422 is connected to the light emitting device 200 or 300 by wire 430. The light emitting device 200 or 300 may be connected to lead frames 421 and 422 by flip-chip bonding or die bonding in addition to wire bonding.

The molding member 440 surrounds and protects the light emitting device 200 or 300. The molding member 440 may include a phosphor 450 to change a wavelength of the light emitting from the light emitting device 200 or 300.

The phosphor 450 may include Garnet phosphor, Silicate phosphor, nitride phosphor, or oxynitride phosphor. For example, the Garnet phosphor may be YAG($Y_3Al_5O_{12}$:$Ce^{3+}$) or TAG ($Tb_3Al_5O_{12}$:$Ce^{3+}$), and the Silicate phosphor may be $(Sr,Ba,Mg,Ca)_2SiO_4$:$Eu^{2+}$, and the nitride phosphor may be $CaAlSiN_3$:$Eu^{2+}$ including SiN, and the oxynitride phosphor may be $Si_{6-x}Al_xO_xN_{8-x}$:$Eu^{2+}$ (0<x<6) including SiON.

The light emitting from the light emitting device 200 or 300 having a first wavelength may be excited by the phosphor 450, and be changed to light having a second wavelength, and optical path of the light having a second wavelength may be changed by passing a lens (not shown).

An array of plural light emitting device packages in accordance with this embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a backlight unit.

In accordance with other embodiments, the light emitting devices or the light emitting device package in accordance with the above-described embodiments may constitute a display apparatus, an indicating apparatus and a lighting system, and, for example, the lighting system may include a lamp or a streetlight.

Figure 22:
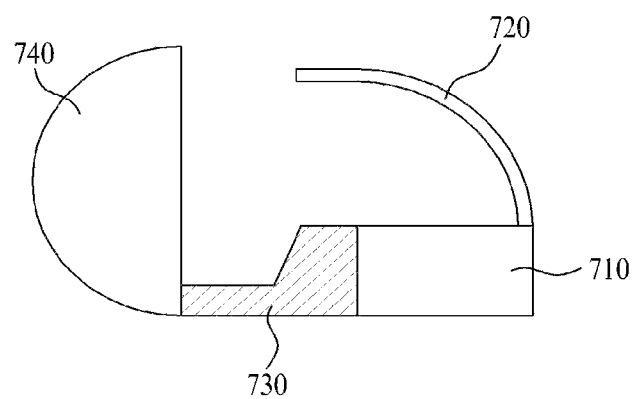
FIG. 22 illustrates a head lamp including the light emitting device package according to the embodiment.

FIG. 22 illustrates a head lamp including the light emitting device package according to the embodiment. Referring to FIG. 22, the head lamp includes a light emitting module 710, a reflector 720, a shade 730 and a lens 740.

The light irradiated from the light emitting module 710 is reflected on the reflector 720 and the shade 730, passes through the lens 740 and extends toward the front of a car body. The light emitting module 710 may include the plurality of the light emitting devices mounted on the printed circuit board.

Figure 23:
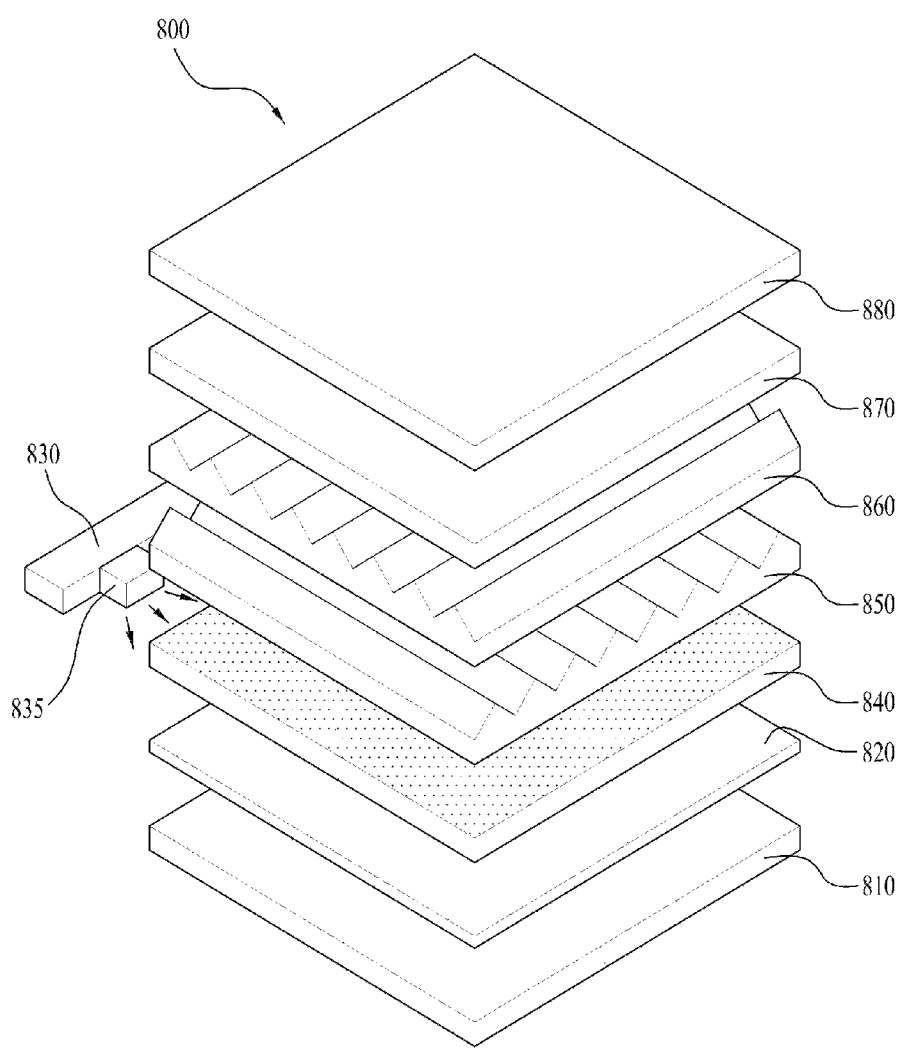
FIG. 23 is a view illustrating a display device including the light emitting device packages according to one embodiment.

FIG. 23 is a view illustrating a display device including the light emitting device packages according to one embodiment. Referring to FIG. 23, the display device 800 according to this embodiment includes a bottom cover 810, a reflective plate 820 disposed on the bottom cover 810, light emitting modules 830 and 835 to emit light, a light guide plate 840 arranged in front of the reflective plate 820 to direct light emitted from the light emitting module toward the front of the display device, an optical sheet including prism sheets 850 and 860 arranged in front of the light guide plate 840, a display panel 870 arranged in front of the optical sheet, an image signal output circuit connected to the display panel 870 and supplying an image signal to the display panel 870, and a color filter 880 arranged in front of the display panel 870. The bottom cover 810, the reflective plate 820, the light emitting modules 830 and 835, the light guide plate 840 and the optical sheet may constitute a backlight unit.

The light emitting module includes light emitting device packages 835 mounted on the circuit substrate 830. The circuit substrate 830 may be a PCB or the like and the light emitting device package 835 is the same as the light emitting device package according to the embodiment illustrated in FIG. 20.

The bottom cover 810 may accommodate constituent components of the display device 800. The reflective plate 820 may be provided as a separate element, as illustrated in the drawing, or may be coated with a material having a high reflectivity provided on the back surface of the light guide plate 840 or the front surface of the bottom cover 810.

Here, the reflective plate 820 may be made of a highly reflective material capable of functioning in an ultra-thin film form and examples thereof include polyethylene terephthalate (PET).

In addition, the light guide plate 840 may be formed of polymethylmethacrylate (PMMA), polycarbonate (PC) or polyethylene (PE).

The first prism sheet 850 is formed at a side of the support film using a light-transmitting and elastic polymer and the polymer may include a prism layer having a plurality of repeatedly formed three-dimensional structures. Here, the plurality of patterns, as illustrated in the drawing, may be provided as stripe patterns in which protrusions and grooves repeatedly alternate.

A direction of the protrusions and grooves arranged on one side of the support film in the second prism sheet 860 may be vertical to a direction of the protrusions and grooves arranged on one side of the support film in the first prism sheet 850 so that light transferred from the light emitting module and the reflective plate can be uniformly distributed in all directions of the display panel 870.

Although not shown, a diffusion sheet may be disposed between the light guide plate 840 and the first prism sheet 850. The diffusion sheet may be made of a polyester or polycarbonate material and maximizes a projection angle of light incident from the backlight unit through refraction and scattering. Also, the diffusion sheet includes a support layer containing a light diffuser, and a first layer and a second layer which are formed on a light emission surface (first prism sheet direction) and a light incident surface (reflection sheet direction) and do not contain a light diffuser.

In this embodiment, the first prism sheet 850 and the second prism sheet 860 constitute an optical sheet and the optical sheet may be for example provided as a micro lens array, a combination of one or more diffusion sheets and a micro lens array, or a combination of one prism sheet and a micro lens array.

The display panel 870 may be a liquid crystal panel and other display devices requiring a light source may be arranged, in addition to the liquid crystal panel 860.

As is apparent from the above description, the embodiments provide a light emitting device to improve adhesion accuracy of phosphor plates and prevent discoloration and cracks of the phosphor plates caused by heat.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a plurality of light emitting cells disposed on the substrate;
   a bridge electrode electrically connecting two adjacent light emitting cells; and
   an insulating layer disposed between the light emitting cells and the bridge electrode,
   wherein the plurality of light emitting cells comprise:
      a light emitting structure including a first conductive type semiconductor layer, a second conductive type semiconductor layer and an active layer between the first conductive type semiconductor layer and the second conductive type semiconductor layer;
      a first electrode on the first conductive type semiconductor layer; and
      a second electrode on the second conductive type semiconductor layer,
   wherein the bridge electrode comprises:
      a first part on a top surface of the first conductive type semiconductor layer and contacting the first electrode in one of the two adjacent light emitting cells;

a second part on a top surface of the second conductive type semiconductor layer and contacting the second electrode in the other of the two adjacent light emitting cells; and a third part disposed on a surface between the first part and the second part, wherein a thickness of the third part is greater than a thickness of the first part and a thickness of the second part, wherein a first roughness is formed on a first region of an upper surface of the substrate between adjacent light emitting cells, wherein the third part of the bridge electrode is disposed on the first region, wherein a second roughness corresponding to the first roughness is formed on an upper surface of the third part of the bridge electrode, and wherein a part of the insulating layer disposed on the first region has a curved surface and a shape of the curved surface is equal to that of an outer periphery of the first roughness.

2. The light emitting device according to claim 1, wherein a width of the bridge electrode is greater than a width of the first electrode layer or a width of the second electrode layer.

3. The light emitting device according to claim 1, the light emitting structure includes an etched region exposing a part of the first conductive type semiconductor layer and the first electrode is disposed on the exposed part of the first conductive type semiconductor layer.

4. The light emitting device according to claim 1, wherein the third part is disposed between the two adjacent light emitting cells.

5. The light emitting device according to claim 1, wherein a height of the first part is equal to a height of the first electrode and a height of the second part is equal to a height of the second electrode.

6. The light emitting device according to claim 1, wherein the bridge electrode is plural in number.

7. The light emitting device according to claim 1, wherein one portion of the first part is disposed on the first electrode and one portion of the second part is disposed on the second electrode.

8. The light emitting device according to claim 1, wherein the bridge electrode further comprises:

a fourth part disposed between the first part and the third part and between the second part and the third part, wherein a thickness of the fourth part is smaller than a thickness of the first part, a thickness of the second part and a thickness of the third part.

9. The light emitting device according to claim 1, further comprising:

a transparent electrode disposed between the second conductive type semiconductor layer and the second electrode.

10. A light emitting device comprising:

a substrate;

a plurality of light emitting cells;

a plurality of bridge electrodes electrically connecting two adjacent light emitting cell; and an insulating layer disposed between the light emitting cells and the bridge electrode, wherein the plurality of light emitting cells comprise:

a light emitting structure including a first conductive type semiconductor layer, a second conductive type semiconductor layer and an active layer between the first conductive type semiconductor layer and the second conductive type semiconductor layer;

wherein the bridge electrode electrically connects the first conductive type semiconductor layer in one of the two adjacent light emitting cells to the second conductive type semiconductor layer in the other of the two adjacent light emitting cells and the plurality of bridge electrodes are disposed between the two adjacent light emitting cells, wherein a first roughness is formed on a first region of an upper surface of the substrate between adjacent light emitting cells, wherein a second roughness is formed on a second region of the bridge electrode which is disposed on the first roughness, wherein a part of the insulating layer disposed on the first region has a curved surface and a shape of the curved surface is equal to that of an outer periphery of the first roughness, and wherein the plurality of bridge electrodes comprise:

a first part on a top surface of the first conductive type semiconductor layer in one of the two adjacent light emitting cells;

a second part on a top surface of the second conductive type semiconductor layer in the other of the two adjacent light emitting cells; and a third part on a surface between the first part and the second part, wherein a thickness of the third part is greater than a thickness of the first part and a thickness of the second part.

11. The light emitting device according to claim 10, wherein the plurality of light emitting cells further comprise:

a first electrode on the first conductive semiconductor layer; and a second electrode on the second conductive semiconductor layer, wherein the plurality of bridge electrodes are disposed between the first electrode in one of the two adjacent light emitting cells and the second electrode in the other of the two adjacent light emitting cells and spaced away from each other.

12. The light emitting device according to claim 11, wherein the first electrode and the second electrode have a first length direction and the plurality of the bridge electrodes have a second length direction which is different with the first length direction.

13. The light emitting device according to claim 11, wherein a width of each of the bridge electrodes is greater than a width of the first electrode layer or a width of the second electrode layer.

14. The light emitting device according to claim 10, wherein the plurality of bridge electrodes comprise:

a first part on the first conductive type semiconductor layer in one of the two adjacent light emitting cells;

a second part on the second conductive type semiconductor layer in the other of the two adjacent light emitting cells; and a third part between the first part and the second part.

15. The light emitting device according to claim 14, wherein a thickness of the first part or a thickness of the first part is equal to a thickness of the third part.

16. The light emitting device according to claim 14, wherein the third part is disposed on the one region of an upper surface of the substrate between adjacent light emitting cells, and the second roughness corresponding to the first roughness is formed on an upper surface of the third part.

17. A light emitting device package comprising:
a package body:
a first lead frame and a second lead frame disposed on a surface of the package body; and
a light emitting device electrically connected to the first lead frame and the second lead frame,
wherein the light emitting device comprises:
   a substrate;
   a plurality of light emitting cells disposed on the substrate;
   a bridge electrode electrically connecting two adjacent light emitting cells; and
   an insulating layer disposed between the light emitting cells and the bridge electrode,
wherein the plurality of light emitting cells comprise:
   a light emitting structure including a first conductive type semiconductor layer, a second conductive type semiconductor layer and an active layer between the first conductive type semiconductor layer and the second conductive type semiconductor layer;
   a first electrode on the first conductive semiconductor layer; and
   a second electrode on the second conductive semiconductor layer,
wherein the bridge electrode comprises:
   a first part on a top surface of the first conductive semiconductor layer and contacting the first electrode in one of the two adjacent light emitting cells;
   a second part on a top surface of the second conductive semiconductor layer and contacting the second electrode in the other of the two adjacent light emitting cells; and
   a third part disposed between the first part and the second part,
   wherein a thickness of the third part is greater than a thickness of the first part and a thickness of the second part,
wherein a first roughness is formed on a first region of an upper surface of the substrate between adjacent light emitting cells,
wherein the third part of the bridge electrode is disposed on the first region,
wherein a second roughness corresponding to the first roughness is formed on an upper surface of the third part of the bridge electrode, and
wherein a part of the insulating layer disposed on the first region has a curved surface and a shape of the curved surface is equal to that of an outer periphery of the first roughness.

* * * * *